US012160648B2

(12) United States Patent
Lee et al.

(10) Patent No.: US 12,160,648 B2
(45) Date of Patent: Dec. 3, 2024

(54) IMAGE SENSOR, CAMERA APPARATUS INCLUDING SAME AND ELECTRONIC APPARATUS INCLUDING THE SAME

(71) Applicant: LG ELECTRONICS INC., Seoul (KR)

(72) Inventors: Jihyun Lee, Seoul (KR); Youngman Kwon, Seoul (KR); Wonkyun Kim, Seoul (KR); Jaehoon Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 17/773,495

(22) PCT Filed: Nov. 1, 2019

(86) PCT No.: PCT/KR2019/014685
§ 371 (c)(1),
(2) Date: Apr. 29, 2022

(87) PCT Pub. No.: WO2021/085694
PCT Pub. Date: May 6, 2021

(65) Prior Publication Data
US 2024/0171836 A1 May 23, 2024

(51) Int. Cl.
*H04N 23/54* (2023.01)
*H01L 27/146* (2006.01)
(Continued)

(52) U.S. Cl.
CPC ....... *H04N 23/54* (2023.01); *H01L 27/14607* (2013.01); *H04M 1/0264* (2013.01); *H04N 25/585* (2023.01)

(58) Field of Classification Search
CPC ................. H04N 23/54; H04N 25/585; H01L 27/14607; H04M 1/0264
(Continued)

(56) References Cited

U.S. PATENT DOCUMENTS

2007/0097240 A1* 5/2007 Egawa ................. H04N 25/00
348/308
2016/0269659 A1 9/2016 Ikeda et al.
(Continued)

FOREIGN PATENT DOCUMENTS

JP 2014-232988 A 12/2014
JP 2017-216647 A 12/2017
(Continued)

*Primary Examiner* — Usman A Khan
(74) *Attorney, Agent, or Firm* — Birch, Stewart, Kolasch & Birch, LLP

(57) ABSTRACT

The present disclosure relates to an image sensor and a camera and an electronic apparatus including the same. An image sensor according to one embodiment of the present disclosure comprises a first light amount detection pixel to detect a first light amount of a first area, a first sensor pixel to output pixel data by converting light of the first area into an electric signal, a second light amount detection pixel to detect a second light amount of a second area, and a second sensor pixel to output pixel data by converting light of the second area into an electric signal, wherein a dynamic range of the first sensor pixel is different from a dynamic range of the second sensor pixel. Accordingly, a high dynamic range may be implemented within one frame.

16 Claims, 29 Drawing Sheets

(51) Int. Cl.
*H04M 1/02* (2006.01)
*H04N 25/585* (2023.01)

(58) Field of Classification Search
USPC .......................................................... 348/335
See application file for complete search history.

(56) References Cited

U.S. PATENT DOCUMENTS

| 2017/0187949 A1* | 6/2017 | Kim ..................... H04N 25/589 |
| 2019/0043900 A1* | 2/2019 | Oka ....................... H04N 25/59 |
| 2019/0051680 A1 | 2/2019 | Hanzawa et al. |

FOREIGN PATENT DOCUMENTS

| JP | 2018-530250 A | 10/2018 |
| KR | 10-2014-0110278 A | 9/2014 |
| KR | 10-2016-0074484 A | 6/2016 |
| KR | 10-2018-0113506 A | 10/2018 |
| KR | 10-2018-0116280 A | 10/2018 |

* cited by examiner

FIG. 5A
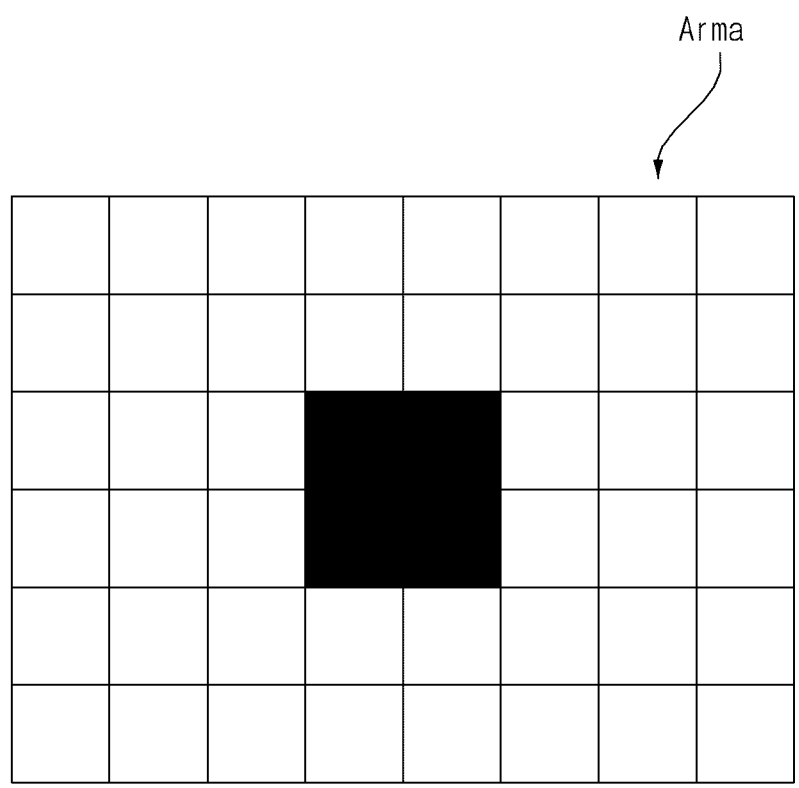
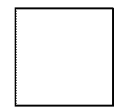 SPa
 SPb

FIG. 5C
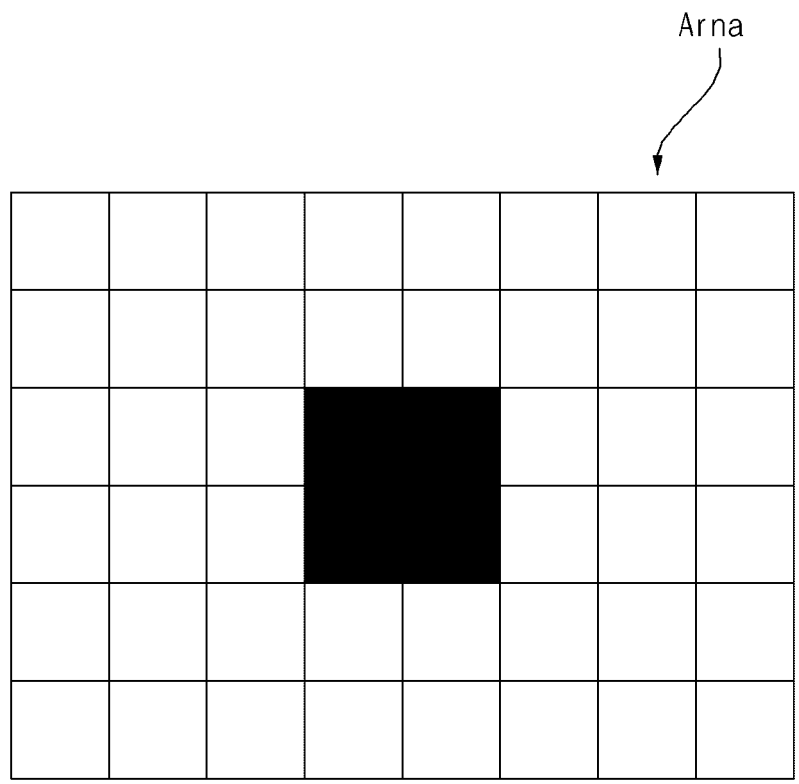
 SPa2
 SPb2

IMAGE SENSOR, CAMERA APPARATUS INCLUDING SAME AND ELECTRONIC APPARATUS INCLUDING THE SAME

CROSS REFERENCE TO RELATED APPLICATION

This application is the National Phase of PCT International Application No. PCT/KR2019/014685, filed on Nov. 1, 2019, which is hereby expressly incorporated by reference into the present application.

BACKGROUND OF THE DISCLOSURE

1. Field of the Disclosure

The present disclosure relates to an image sensor and a camera and an electronic apparatus including the same and more particularly, to an image sensor capable of implementing high dynamic range imaging within one frame, and a camera and an electronic apparatus including the same.

2. Description of the Related Art

A camera is an apparatus for photographing an image. An image sensor is employed inside a camera for photographing an image.

Meanwhile, recently, research has been conducted on a method for capturing a high dynamic range (HDR)-based image by a camera to obtain high dynamic range images.

U.S. Pat. No. 9,160,936 (in what follows, it is referred to as "prior art") implements a high dynamic range through a mixing process based on pixel data having at least two exposure values.

However, according to the prior art, to implement high dynamic range imaging, it is necessary to acquire a high sensitivity image and a low-sensitivity image, which brings an adverse effect of requiring an extended data acquisition time to capture two or more frames.

In particular, due to the limits set on the brightest part and the darkest part, a situation in which two or more frames are required frequently occurs.

Also, according to the prior art, when there is a fast movement of an object, distortions may occur during image synthesis, which may affect image quality.

SUMMARY

It is an object of the present disclosure to provide a slim image sensor capable of implementing high dynamic range imaging within one frame, and a camera and an electronic apparatus including the image sensor.

It is another object of the present disclosure to an image sensor capable of implementing different conversion gains for the respective areas within one frame, and a camera and an electronic apparatus including the image sensor.

It is yet another object of the present disclosure to provide an image sensor capable of implementing different sensitivity for each area within one frame, and a camera and an electronic apparatus including the image sensor.

It is yet another object of the present disclosure to provide an image sensor capable of implementing different slopes of voltage change across photodiodes for the respective areas within one frame, and a camera and an electronic apparatus including the image sensor.

In accordance with an aspect of the present disclosure, the above and other objects can be accomplished by providing an image sensor and a camera and an electronic apparatus including the same according to one embodiment of the present disclosure comprise a first light amount detection pixel to detect a first light amount of a first area, a first sensor pixel to output pixel data by converting light of the first area into an electric signal, a second light amount detection pixel to detect a second light amount of a second area, and a second sensor pixel to output pixel data by converting light of the second area into an electric signal, wherein a dynamic range of the first sensor pixel is different from a dynamic range of the second sensor pixel.

Meanwhile, the conversion gain of the first sensor pixel is different from the conversion gain of the second sensor pixel.

Meanwhile, sensitivity of the first sensor pixel is different from the sensitivity of the second sensor pixel.

Meanwhile, a slope of voltage change across a photodiode within the first sensor pixel is different from the slope of voltage change across a photodiode within the second sensor pixel.

Meanwhile, in case in which the second light amount is greater than the first light amount, the dynamic range of the second sensor pixel is less than the dynamic range of the first sensor pixel.

Meanwhile, in case in which the second light amount is greater than the first light amount, the conversion gain of the second sensor pixel is smaller than the conversion gain of the first sensor pixel.

Meanwhile, in case in which the second light amount is greater than the first light amount, sensitivity of the second sensor pixel is lower than the sensitivity of the first sensor pixel.

Meanwhile, in case in which the second light amount is greater than the first light amount, slope magnitude of voltage change across a photodiode within the first sensor pixel is less than the slop magnitude of voltage change across a photodiode within the second sensor pixel.

Meanwhile, an image sensor and a camera and an electronic apparatus including the same according to one embodiment of the present disclosure may further include a first reference level determination processor to determine a first reference level based on a pixel signal or a count value from the first light amount detection pixel and a second reference level determination processor to determine a second reference level based on a pixel signal or a count value from the second light amount pixel.

Meanwhile, the first sensor pixel may adjust a dynamic range of the first sensor pixel based on the first reference level determined by the first reference level determination processor, and the second sensor pixel may adjust a dynamic range of the second sensor pixel based on the second reference level determined by the second reference level determination processor.

Meanwhile, the first sensor pixel may adjust sensitivity of the first sensor pixel based on the first reference level determined by the first reference level determination processor, and the second sensor pixel may adjust sensitivity of the second sensor pixel based on the second reference level determined by the second reference level determination processor.

Meanwhile, the first light amount detection pixel may comprise a photodiode to convert light into an electric signal, a comparator to output a pulse signal based on a voltage across the photodiode and a reference voltage, and a counter to count the number of pulses of the pulse signal from the comparator.

Meanwhile, the first light amount detection pixel may further include a reset switching element resetting the voltage across the photodiode.

Meanwhile, an image sensor and a camera and an electronic apparatus including the same according to one embodiment of the present disclosure may further include a feedback circuit to output a feedback signal to a reset switching element by feeding back the comparator output.

Meanwhile, the first sensor pixel may include a second photodiode to convert light into an electric signal, a switching element to perform switching based on a signal from the first reference level determination processor, and a capacitor, one end of which is connected to one end of the switching element.

Meanwhile, the first sensor pixel may further include a reset switching element, one end of which is connected to the other end of a switching element, a first output switching element, one end of which is connected to the other end of the reset switching element, and a second output switching element, one end of which is connected to the first output switching element.

In accordance with another aspect of the present disclosure, the above and other objects can be accomplished by providing an image sensor and a camera and an electronic apparatus including the same according to another embodiment of the present disclosure may comprise a photodiode to convert light into an electric signal, a switching element to be turned on or off based on a gain change signal from the outside, and a capacitor, one end of which is connected to one end of the switching element, wherein the switching element may perform switching to be turned off until a first time point within a first frame period and turned on, based on the gain change signal from the outside, from the first time point to a second time point within the first frame period.

Meanwhile, the slope of voltage change across the photodiode before the first time point is a first slope, and the slope of voltage change across the photodiode from the first time point to the second time point is a second slope having a less change rate than the first slope.

Meanwhile, an image sensor and a camera and an electronic apparatus according to yet another embodiment of the present disclosure may further comprise a second photodiode to convert light into an electric signal, a comparator to output a pulse signal based on a voltage across the second photodiode and a reference voltage, and a counter to count the number of pulses of the pulse signal from the comparator, wherein as the amount of light incident on the second photodiode increases, a pulse interval of the pulse signal output from the comparator decreases.

Meanwhile, a reference level determination processor to output a gain change signal when the count value of the counter is greater than or equal to a predetermined value may be further included.

Effects of the Disclosure

An image sensor and a camera and an electronic apparatus including the same according to one embodiment of the present disclosure comprise a first light amount detection pixel to detect a first light amount of a first area, a first sensor pixel to output pixel data by converting light of the first area into an electric signal, a second light amount detection pixel to detect a second light amount of a second area, and a second sensor pixel to output pixel data by converting light of the second area into an electric signal, wherein a dynamic range of the first sensor pixel is different from a dynamic range of the second sensor pixel. Accordingly, a high dynamic range may be implemented within one frame. In particular, different dynamic ranges may be implemented for the respective areas within one frame.

Meanwhile, the conversion gain of the first sensor pixel is different from the conversion gain of the second sensor pixel. Accordingly, different conversion gains may be implemented for the respective areas within one frame.

Meanwhile, sensitivity of the first sensor pixel is different from the sensitivity of the second sensor pixel. Accordingly, different sensitivity may be implemented for each area within one frame.

Meanwhile, a slop of voltage change across a photodiode within the first sensor pixel is different from the slop of voltage change across a photodiode within the second sensor pixel. Accordingly, a different slop of voltage change across a photodiode may be implemented for each area within one frame.

Meanwhile, in case in which the second light amount is greater than the first light amount, the dynamic range of the second sensor pixel is less than the dynamic range of the first sensor pixel. Accordingly, as the amount of light increases, the dynamic range may be configured to decrease.

Meanwhile, in case in which the second light amount is greater than the first light amount, the conversion gain of the second sensor pixel is smaller than the conversion gain of the first sensor pixel. Accordingly, as the amount of light increases, the conversion gain may be configured to decrease.

Meanwhile, in case in which the second light amount is greater than the first light amount, sensitivity of the second sensor pixel becomes lower than the sensitivity of the first sensor pixel. Accordingly, as the amount of light increases, sensitivity of a sensor pixel may be configured to decrease.

Meanwhile, in case in which the second light amount is greater than the first light amount, slop magnitude of voltage change across a photodiode within the second sensor pixel is greater than the slop magnitude of voltage change across a photodiode within the first sensor pixel. Accordingly, as the amount of light increases, slop magnitude of voltage change across a photodiode may be configured to increase.

Meanwhile, an image sensor and a camera and an electronic apparatus including the same according to one embodiment of the present disclosure may further include a first reference level determination processor to determine a first reference level based on a pixel signal or a count value from the first light amount detection pixel and a second reference level determination processor to determine a second reference level based on a pixel signal or a count value from the second light amount pixel. Accordingly, based on the light amount or the count value, a second reference level for switching control may be determined, and as a result, adjustment of sensitivity level in multiple steps becomes possible. Also, due to the count operation, saturation of an image pixel may be prevented.

Meanwhile, the first sensor pixel may adjust a dynamic range of the first sensor pixel based on the first reference level determined by the first reference level determination processor, and the second sensor pixel may adjust a dynamic range of the second sensor pixel based on the second reference level determined by the second reference level determination processor. Accordingly, the dynamic range may be adjusted for each area within one frame.

Meanwhile, the first sensor pixel may adjust sensitivity of the first sensor pixel based on the first reference level determined by the first reference level determination processor, and the second sensor pixel may adjust sensitivity of the second sensor pixel based on the second reference level determined by the second reference level determination processor. Accordingly, sensitivity of a sensor pixel may be adjusted for each area within one frame.

Meanwhile, the first light amount detection pixel may comprise a photodiode to convert light into an electric signal, a comparator to output a pulse signal based on a voltage across the photodiode and a reference voltage, and a counter to count the number of pulses of the pulse signal from the comparator. Accordingly, saturation of an image pixel may be prevented due to the count operation.

Meanwhile, the first light amount detection pixel may further include a reset switching element resetting the voltage across the photodiode. Accordingly, counting based on a light amount detection pixel may be performed.

Meanwhile, an image sensor and a camera and an electronic apparatus including the same according to one embodiment of the present disclosure may further include a feedback circuit to output a feedback signal to a reset switching element by feeding back the comparator output. Accordingly, counting may be performed based on a light amount detection pixel.

Meanwhile, the first sensor pixel may include a second photodiode to convert light into an electric signal, a switching element to perform switching based on a signal from the first reference level determination processor, and a capacitor, one end of which is connected to one end of the switching element. Accordingly, a conversion gain may be configured based on the capacitance of a capacitor.

Meanwhile, the first sensor pixel may further include a reset switching element, one end of which is connected to the other end of a switching element, a first output switching element, one end of which is connected to the other end of the reset switching element, and a second output switching element, one end of which is connected to the first output switching element. Accordingly, adjustment of sensitivity level may be performed in multiple steps.

Meanwhile, an image sensor and a camera and an electronic apparatus including the same according to another embodiment of the present disclosure may comprise a photodiode to convert light into an electric signal, a switching element to be turned on or off based on a gain change signal from the outside, and a capacitor, one end of which is connected to one end of the switching element, wherein the switching element may perform switching to be turned off until a first time point within a first frame period and turned on, based on the gain change signal from the outside, from the first time point to a second time point within the first frame period. Accordingly, sensitivity of a pixel may be changed in real-time within one frame. Also, the frequency of occurrence of voltage saturation before exposure time for one frame may be reduced.

Meanwhile, the slope of voltage change across the photodiode before the first time point is a first slope, and the slope of voltage change across the photodiode from the first time point to the second time point is a second slope having a less change rate than the first slope. Accordingly, sensitivity of a pixel may be changed in real-time within one frame. Also, the frequency of occurrence of voltage saturation may be reduced before exposure time for one frame.

Meanwhile, an image sensor and a camera and an electronic apparatus according to yet another embodiment of the present disclosure may further comprise a second photodiode to convert light into an electric signal, a comparator to output a pulse signal based on a voltage across the second photodiode and a reference voltage, and a counter to count the number of pulses of the pulse signal from the comparator, wherein as the amount of light incident on the second photodiode increases, a pulse interval of the pulse signal output from the comparator decreases. Accordingly, counting due to the amount of light may be performed accurately.

Meanwhile, when the count value of the counter is greater than or equal to a predetermined value, a reference level determination processor to output a gain change signal may be further included. Accordingly, a reference level for switching control may be determined based on the amount of light or a count value, and as a result, adjustment of sensitivity level in multiple steps becomes possible. Also, due to the count operation, saturation of an image pixel may be prevented.

BRIEF DESCRIPTION OF THE DRAWINGS

The objects, features and advantages of the present disclosure will be more apparent from the following detailed description in conjunction with the accompanying drawings, in which:

FIGS. 5A to 5F are drawings referenced for the description of FIG. 4;

DETAILED DESCRIPTION OF THE PREFERRED EMBODIMENTS

Hereinafter, the present disclosure will be described in detail with reference to the accompanying drawings.

With respect to constituent elements used in the following description, suffixes "module" and "unit" are given only in consideration of ease in the preparation of the specification, and do not have or serve as different meanings. Accordingly, the suffixes "module" and "unit" may be used interchangeably.

Figure 1A:
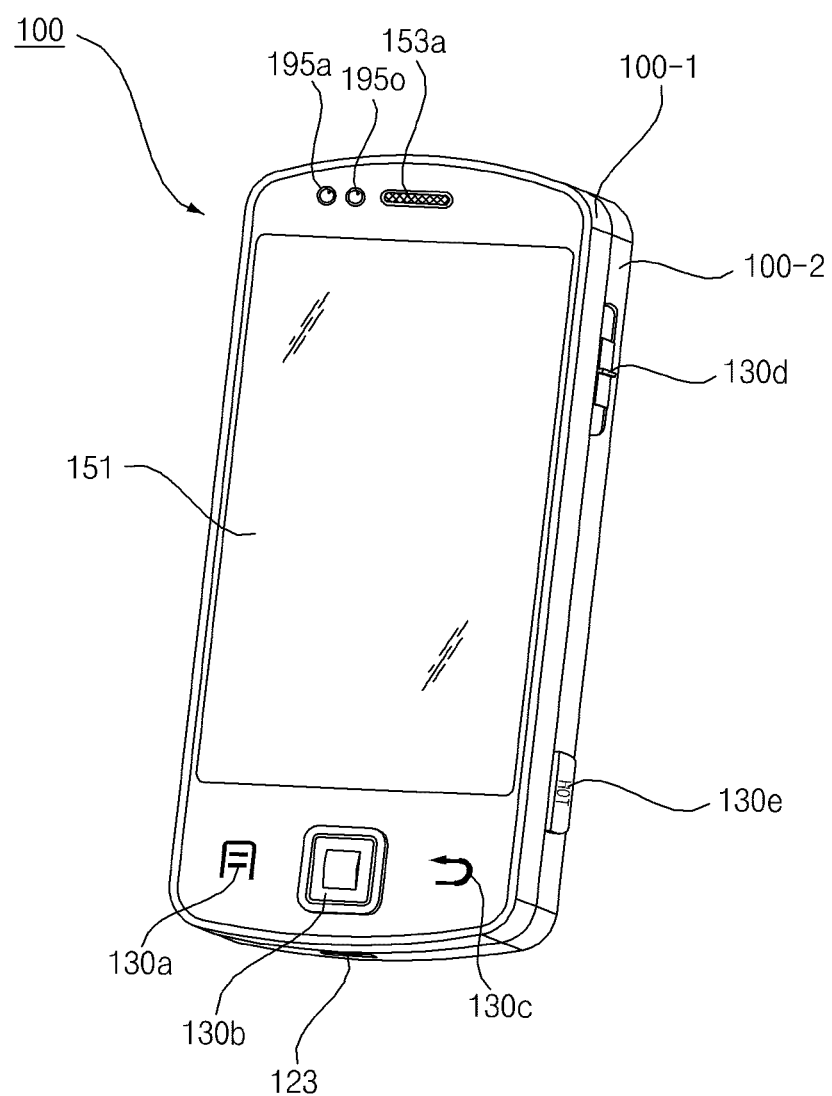
FIG. 1A is a perspective view of a mobile terminal as an example of an electronic apparatus according to an embodiment of the present disclosure.
Figure 1B:
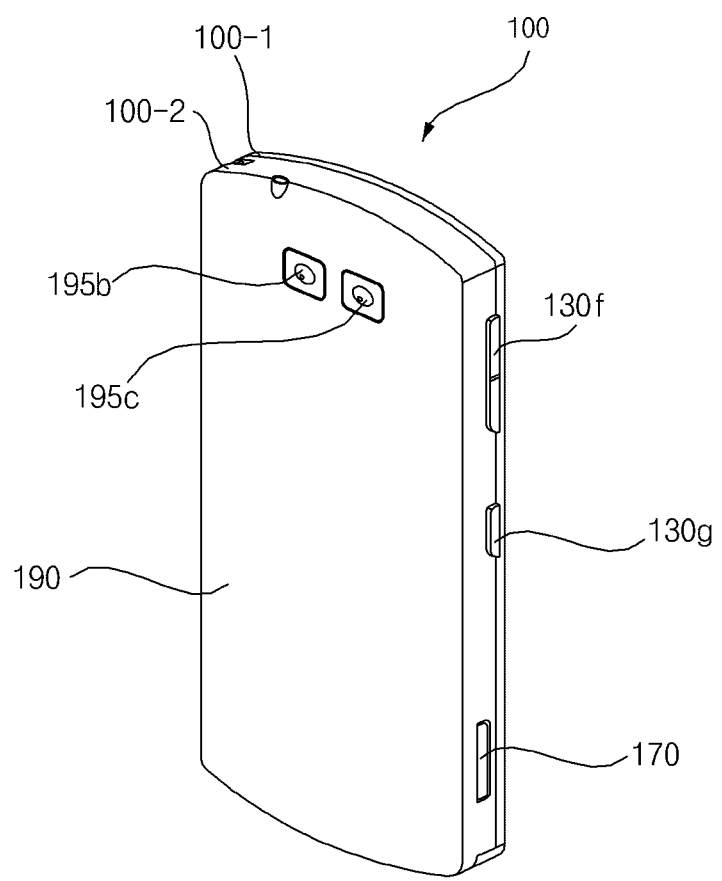
FIG. 1B is a rear perspective view of a mobile terminal shown in FIG. 1A.

FIG. 1A is a perspective view of a mobile terminal as an example of an electronic apparatus according to an embodiment of the present disclosure, and FIG. 1B is a rear perspective view of a mobile terminal shown in FIG. 1A.

Referring to FIG. 1A, a case forming an outer appearance of a mobile terminal 100 may be formed by a front case 100-1 and a rear case 100-2. Various electronic elements may be embedded in a space formed by the front case 100-1 and the rear case 100-2.

Specifically, a display 180, a first sound output device 153a, a first camera 195a, a second camera 195o, and a first to third user input devices 130a, 130b, and 130c may be disposed in the front case 100-1. Further, a fourth user input device 130d, a fifth user input device 130e, and a microphone 123 may be disposed on a lateral surface of the rear case 100-2.

In the display 180, a touchpad may be overlapped in a layer structure so that the display 180 may operate as a touch screen.

The first sound output device 153a may be implemented in the form of a receiver or a speaker. The first camera 195a may be implemented in a form suitable for photographing an image or a moving image of a user, and the like. The microphone 123 may be implemented in a form suitable for receiving a user's voice, other sounds, and the like.

The first to fifth user input devices 130a, 130b, 130c, 130d and 130e and a sixth and seventh user input devices 130f and 130g described below may be collectively referred to as a user input device 130.

The microphone 123 may be disposed in the lower side of the rear case 100-2, i.e., in the lower side of the mobile terminal 100, so as to collect an audio signal. Otherwise the microphone 123 may be disposed in the upper side of the rear case 100-2, i.e., in the upper side of the mobile terminal 100, so as to collect an audio signal.

Referring to FIG. 1B, a third camera 195b, a fourth camera 195c, and a fourth microphone (not shown) may be additionally mounted on the rear surface of the rear case 100-2, and a sixth and seventh user input devices 130f and 130g, and an interface 175 may be disposed on the lateral surface of the rear case 100-2.

The third camera 195b has a photographing direction substantially opposite to that of the first camera 195a, and may have different pixels from the first camera 195a. A flash (not shown) and a mirror (not shown) may be additionally disposed adjacent to the third camera 195b. In addition, another camera may be installed adjacent to the third camera 195b to be used for shooting a three-dimensional stereoscopic image.

A second sound output device (not shown) may be additionally disposed in the rear case 100-2. The second sound output device may implement a stereo function together with the first sound output device 153a, and may be used for talking in a speakerphone mode.

A power supply 190 for supplying power to the mobile terminal 100 may be mounted in the rear case 100-2. The power supply 190 may be, for example, a rechargeable battery and may be detachably coupled to the rear case 100-2 for charging or the like.

The microphone 123 may be disposed in the front surface of the rear case 100-2, i.e., in the rear surface of the mobile terminal 100 so as to collect an audio signal.

Figure 2:
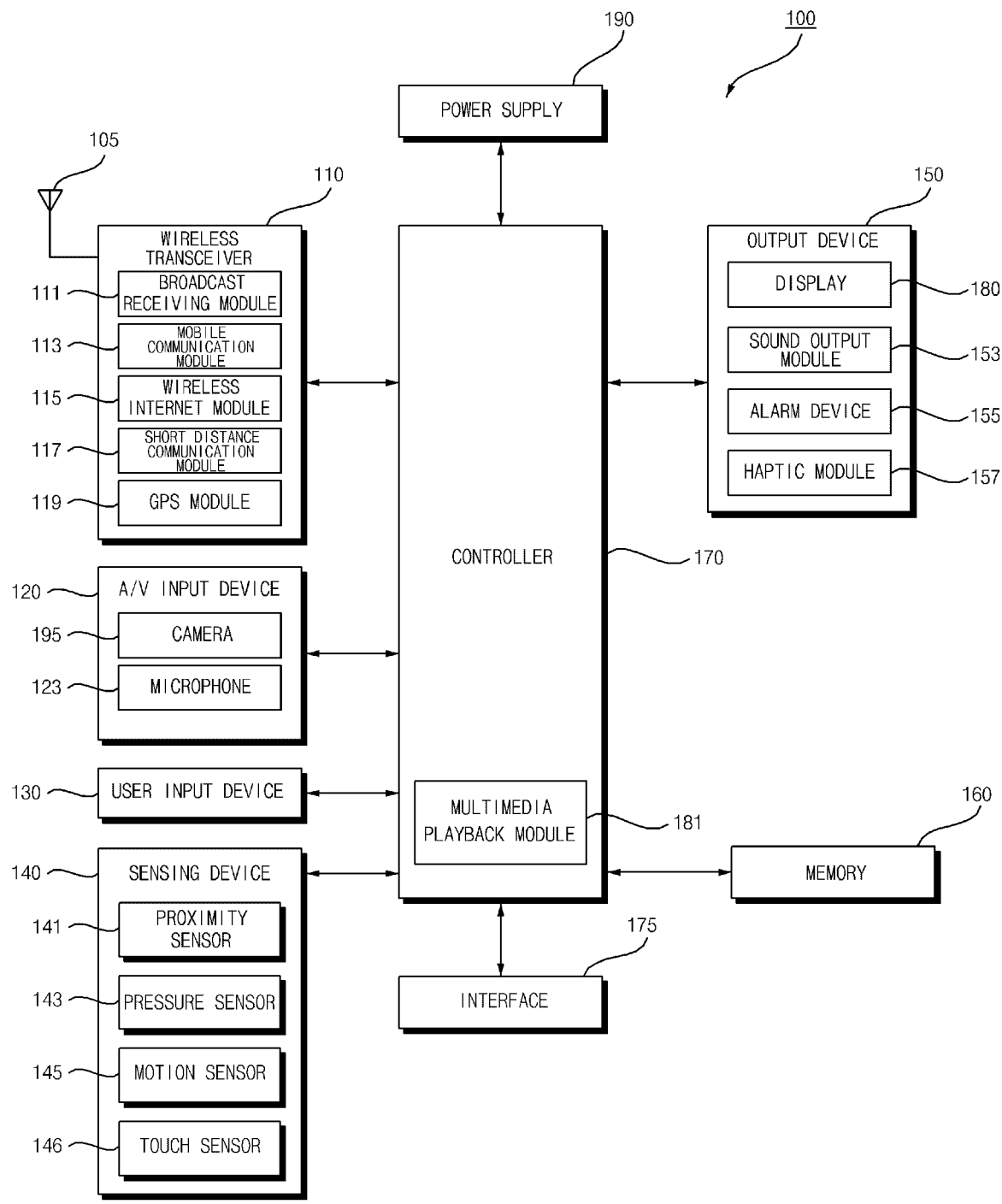
FIG. 2 is a block diagram of a mobile terminal of FIG. 1 according to an embodiment of the present disclosure.

FIG. 2 is a block diagram of a mobile terminal of FIG. 1 according to an embodiment of the present disclosure.

Referring to FIG. 2, the mobile terminal 100 may include a wireless transceiver 110, an audio/video (A/V) input device 120, a user input device 130, a sensing device 140, an output device 150, a memory 160, an interface 175, a controller 170, and a power supply 190. When these elements are implemented in an actual application, two or more elements may be combined into one element if necessary, or one element may be divided into two or more elements.

The wireless transceiver 110 may include a broadcast receiver 111, a mobile communication module 113, a wireless Internet module 115, a short distance communication module 117, and a GPS module 119.

The broadcast receiver 111 may receive at least one of a broadcast signal or broadcast related information from an external broadcast management server through a broadcast channel. The broadcast signal and/or broadcast related information received through the broadcast receiver 111 may be stored in the memory 160.

The mobile communication module 113 may transmit and receive a wireless signal to at least one of a base station, an external terminal, or a server on a mobile communication network. Here, the wireless signal may include various types of data in accordance with a voice call signal, a video call signal, or a character/multimedia message transmission/reception.

The wireless Internet module 115 refers to a module for wireless Internet access, and the wireless Internet module 115 may be embedded in the mobile terminal 100 or externally provided.

The short distance communication module 117 refers to a module for short distance communication. BLUETOOTH, Radio Frequency Identification (RFID), infrared Data Association (IrDA), Ultra Wideband (UWB), ZigBee, and Near Field Communication (NFC) may be used as a short distance communication technology.

The Global Position System (GPS) module 119 may receive position information from a plurality of GPS satellites.

The audio/video (A/V) input device 120 may be used to input an audio signal or a video signal, and may include a camera 195, the microphone 123, and the like.

The camera 195 may process an image frame such as a still image or a moving image acquired by an image sensor in a video call mode or a photographing mode. Then, the processed image frame may be displayed on the display 180.

The image frame processed by the camera 195 may be stored in the memory 160 or transmitted to the outside through the wireless transceiver 110. Two or more cameras 195 may be provided according to the configuration of the electronic apparatus.

The microphone 123 may receive an external audio signal by a microphone in a display off mode, e.g., a call mode, a recording mode, or a voice recognition mode, and may process the audio signal into an electrical voice data.

Meanwhile, a plurality of microphones 123 may be disposed in different positions. The audio signal received in each microphone may be audio-signal processed in the controller 170, or the like.

The user input device 130 may generate key input data that the user inputs for controlling the operation of the electronic apparatus. The user input device 130 may include a key pad, a dome switch, and a touch pad (static pressure scheme/capacitive scheme) capable of receiving a command or information by a user's pressing or touching operation. In particular, when the touch pad has a mutual layer structure with the display 180 described later, it may be referred to as a touch screen.

The sensing device 140 may detect the current state of the mobile terminal 100 such as the open/close state of the mobile terminal 100, the position of the mobile terminal 100, the contact of the user, and the like, and may generate a sensing signal for controlling the operation of the mobile terminal 100.

The sensing device 140 may include a proximity sensor 141, a pressure sensor 143, a motion sensor 145, a touch sensor 146, and the like.

The proximity sensor 141 may detect an object approaching the mobile terminal 100 or an object in the vicinity of the mobile terminal 100 without mechanical contact. In particular, the proximity sensor 141 may detect a nearby object by using a change in the alternating magnetic field or a change in the static magnetic field, or by using a change rate of the capacitance.

The pressure sensor 143 may detect whether a pressure is applied to the mobile terminal 100, or detect the magnitude of the pressure, and the like.

The motion sensor 145 may detect the position or motion of the mobile terminal 100 by using an acceleration sensor, a gyro sensor, or the like.

The touch sensor 146 may detect a touch input by a user's finger or a touch input by a specific pen. For example, when a touch screen panel is disposed on the display 180, the touch screen panel may include a touch sensor 146 for sensing position information and intensity information of the touch input. A sensing signal sensed by the touch sensor 146 may be transmitted to the controller 170.

The output device 150 may be used to output an audio signal, a video signal, or an alarm signal. The output device 150 may include a display 180, a sound output device 153, an alarm device 155, and a haptic device 157.

The display 180 may display and output information processed by the mobile terminal 100. For example, when the mobile terminal 100 is in the call mode, a user interface (UI) or graphic user interface (GUI) related with the call may be displayed. When the mobile terminal 100 is in the video call mode or the photographing mode, the photographed or received image may be displayed individually or simultaneously, and the UI and the GUI may be displayed.

Meanwhile, as described above, when the display 180 and the touch pad form a mutual layer structure to constitute a touch screen, the display 180 may be used as an input apparatus capable of inputting information by a user's touch in addition to an output apparatus.

The sound output device 153 may output the audio data received from the wireless transceiver 110 or stored in the memory 160 in a call signal reception, a call mode or a recording mode, a voice recognition mode, a broadcast reception mode, and the like. In addition, the sound output device 153 may output an audio signal related to the function performed in the mobile terminal 100, e.g., a call signal reception tone, a message reception tone, and the like. The sound output device 153 may include a speaker, a buzzer, and the like.

The alarm device 155 may output a signal for notifying the occurrence of an event of the mobile terminal 100. The alarm device 155 may output a signal for notifying the occurrence of an event in a different form from an audio signal or a video signal. For example, it is possible to output a signal in a form of vibration.

The haptic device 157 may generate various tactile effects that the user can feel. A typical example of the tactile effect generated by the haptic device 157 may be a vibration effect. When the haptic device 157 generates vibration with a tactile effect, the intensity and pattern of the vibration generated by the haptic device 157 can be converted, and different vibrations may be synthesized to be outputted or may be sequentially outputted.

The memory 160 may store a program for the processing and controlling of the controller 170, and may serve to temporarily store inputted or outputted data (e.g., a phone book, a message, a still image, a moving image, or the like).

The interface 175 may serve as an interface with all external apparatuses connected to the mobile terminal 100. The interface 175 may receive data from an external apparatus or receive power from the external apparatus to transmit to each element in the mobile terminal 100, and allow the data in the mobile terminal 100 to be transmitted to the external apparatus.

The controller 170 may control, in general, the operation of each unit to control the overall operation of the mobile terminal 100. For example, the controller 170 may perform relevant control and processing for voice call, data communication, video call, and the like. In addition, the controller 170 may include a multimedia playback module 181 for playing multimedia. The multimedia playback module 181 may be configured in hardware inside the controller 170 or may be configured in software separately from the controller 170. Meanwhile, the controller 170 may include an application processor (not shown) for driving an application. Alternatively, the application processor (not shown) may be provided separately from the controller 170.

The power supply 190 may receive external power or internal power under the control of the controller 170 to supply power required for operation of each element.

Figure 3A:
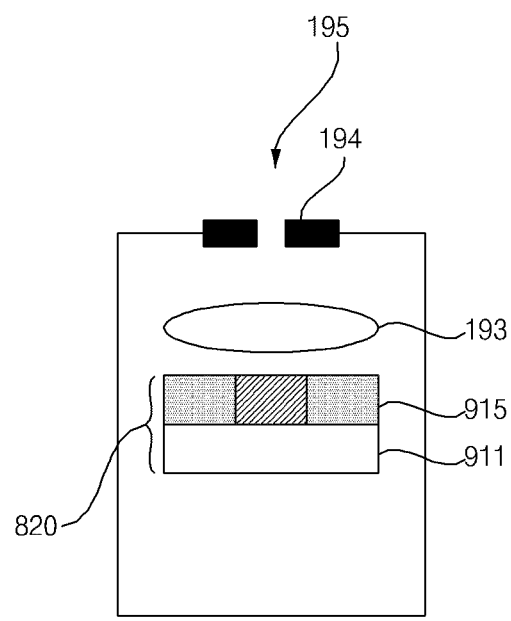
FIG. 3A is an internal cross-sectional view of a camera of FIG. 2 according to an embodiment of the present disclosure.

FIG. 3A is an internal cross-sectional view of a camera of FIG. 2.

Referring to the drawing, FIG. 3A is an example of a cross-sectional view of the camera 195.

The camera 195 may include an aperture 194, a lens apparatus 193, and an image sensor 820.

The aperture 194 may open and close the light input on the lens apparatus 193.

The image sensor 820 may include an RGB filter 915, and a sensor array 911 for converting an optical signal into an electric signal, in order to sense RGB colors.

Accordingly, the image sensor 820 may sense and output RGB images, respectively.

Figure 3B:
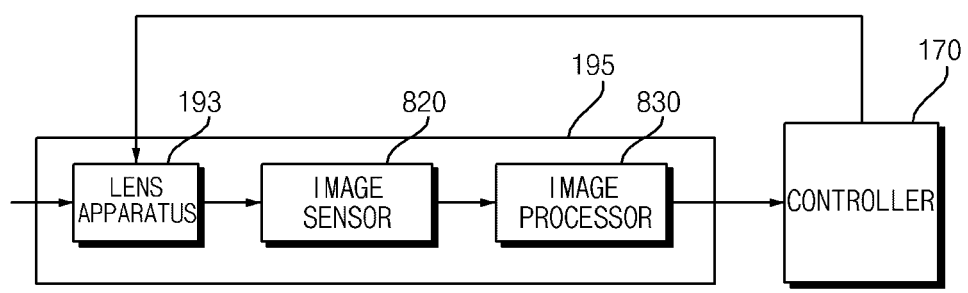
FIG. 3B is an internal block diagram of a camera of FIG. 2 according to an embodiment of the present disclosure.

FIG. 3B is an internal block diagram of a camera of FIG. 2.

Referring to the drawing, FIG. 3B is an example of a block diagram for the camera 195.

The camera 195 may include an aperture 194, a lens apparatus 193, an image sensor 820, and an image processor 830.

The aperture 194 may open and close the light input on the lens apparatus 193.

The lens apparatus 193 receives the input light from the aperture 194 and may be provided with a plurality of lenses that are adjusted for variable focus.

The image processor 830 may generate an RGB image based on an electric signal from the image sensor 820.

In particular, the image processor 830 may generate an image signal based on the input light passing through the lens apparatus 193.

Meanwhile, the image sensor 820 may adjust an exposure time based on the electric signal.

Meanwhile, the RGB image from the image processor 830 may be transmitted to the controller 170 of the mobile terminal 100.

Meanwhile, the controller 170 of the mobile terminal 100 may output a control signal to the lens apparatus 193 for the movement of a lens in the lens apparatus 193. For example, a control signal for autofocusing may be outputted to the lens apparatus 193.

Meanwhile, the controller 170 of the mobile terminal 100 may output an aperture control signal for controlling opening and closing of the aperture 194 to the aperture 194.

Figure 4:
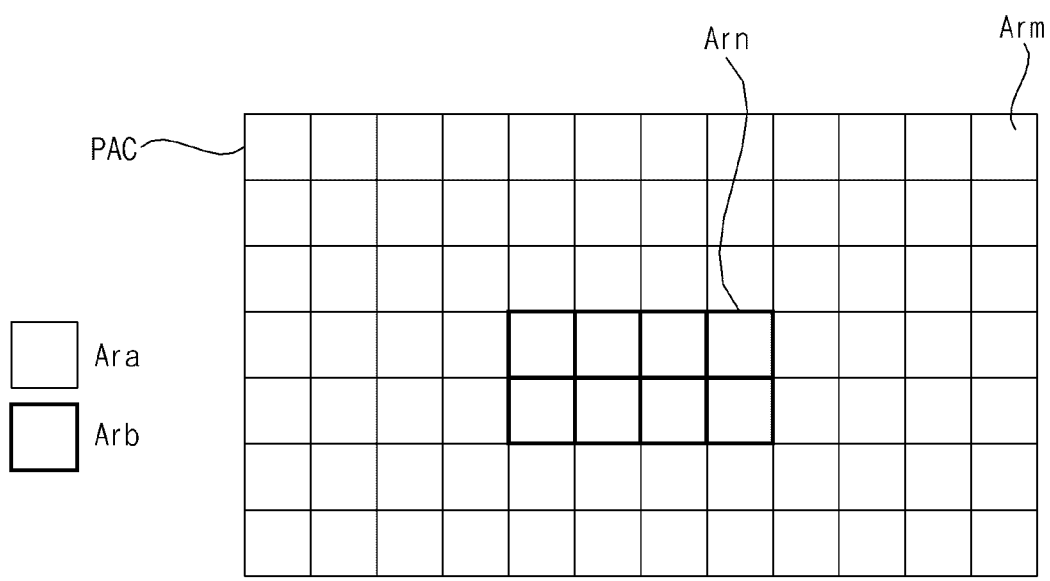
FIG. 4 illustrates an image sensor according to an embodiment of the present disclosure.

FIG. 4 illustrates an image sensor according to an embodiment of the present disclosure, and FIGS. 5A to 5E are drawings referenced for the description of FIG. 4.

First, referring to FIG. 4, an image sensor PAC according to an embodiment of the present disclosure may have a plurality of sensor pixels.

In particular, the image sensor PAC according to an embodiment of the present disclosure may include a first light amount detection pixel Spb that detects a first light amount of a first area Arm, a first sensor pixel Spa that outputs pixel data by converting the light of the first area Arm into an electric signal, a second light amount detection pixel Spb2 that detects a second light amount of a second area Arn, and a second sensor pixel Spa2 that outputs pixel data by converting the light of the second area Arn into an electric signal.

For example, as shown in the FIGURE, when different amounts of light are incident on the second area Arn, the central area of the image sensor PAC, and the first area Arm, the edge area of the image sensor PAC, it is preferable that the first area Arm and the second area Arn output respective pixel data due to the different amounts of light.

On the other hand, to implement a high dynamic range within one frame, it is preferable that the image sensor PAC according to an embodiment of the present disclosure includes a first light amount detection pixel Spb for detecting a first light amount of the first area Arm and a second light amount detection pixel Spb2 for detecting a second light amount of the second area Arn.

FIG. 5A shows a first light amount detection pixel Spb detecting a first light amount within a first area Arma and a first sensor pixel Spa outputting pixel data by converting the light of the first area Arma into an electric signal.

In particular, FIG. 5A shows a case in which the first light amount detection pixel Spb is disposed in the central area within the first area Arma and first sensor pixels Spa outputting pixel data by converting light into an electric signal are disposed in the area except for the central area.

Figure 5B:
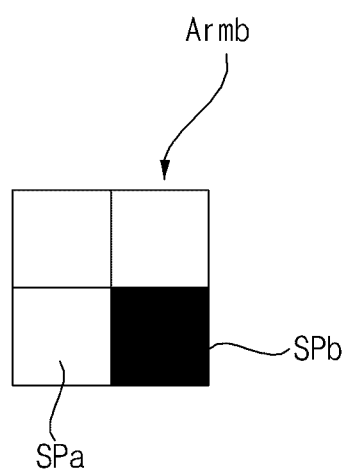

Different from FIG. 5A, FIG. 5B shows a case in which the first light amount detection pixel Spb is disposed in the bottom-right area within the first area Armb and the first sensor pixels Spa outputting pixel data by converting light into an electric signal are disposed in the area except for the bottom-right area.

FIG. 5C shows a second light amount detection pixel Spb2 detecting a second light amount within a second area Arna and a second sensor pixel Spa2 outputting pixel data by converting the light of the second area Arna into an electric signal.

In particular, FIG. 5C shows a case in which the second light amount detection pixel Spb2 is disposed in the central area within the second area Arna and second sensor pixels Spa2 outputting pixel data by converting light into an electric signal are disposed in the area except for the central area.

Figure 5D:
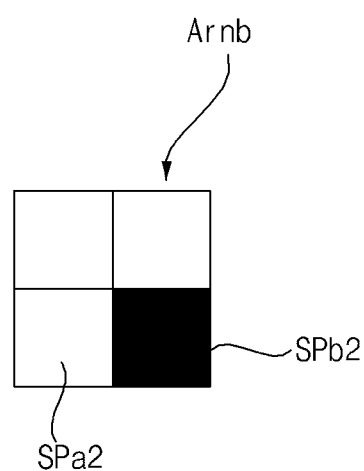

Different from FIG. 5C, FIG. 5D shows a case in which the second light amount detection pixel Spb2 is disposed in the bottom-right area within the second area Arnb and the second sensor pixels Spa2 outputting pixel data by converting light into an electric signal are disposed in the area except for the bottom-right area.

Figure 5E:
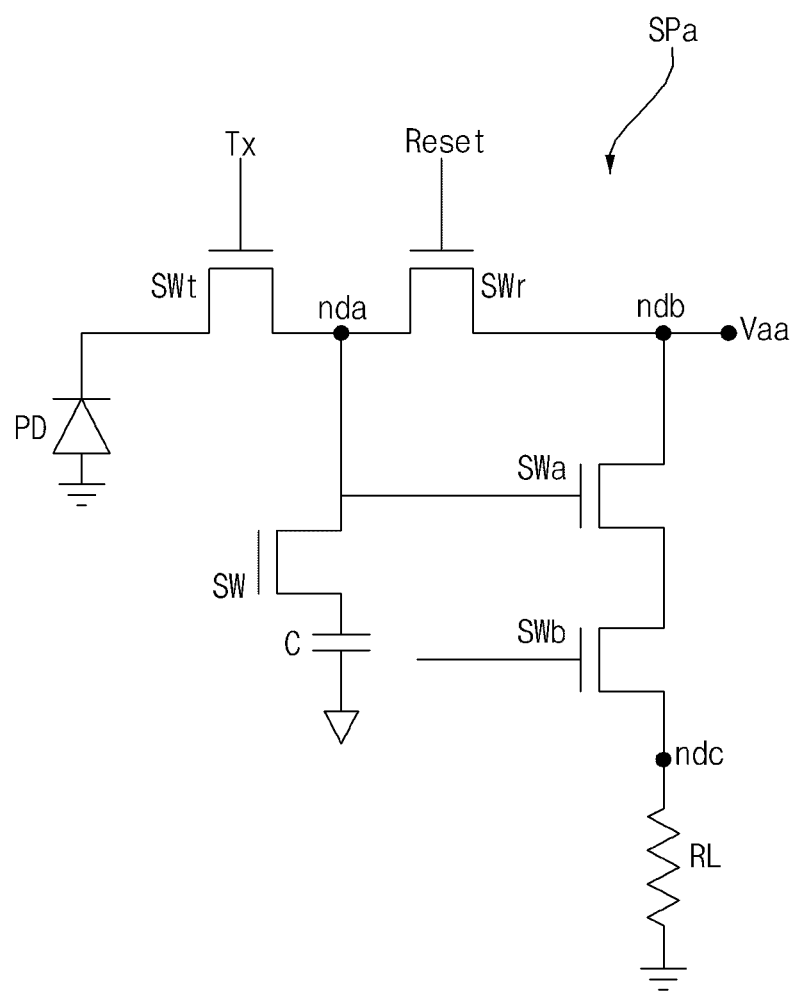

FIG. 5E shows an example of the first sensor pixel Spa within the first area Arm.

The first sensor pixel Spa may include a photodiode PD converting light into an electric signal, a transfer switching element SWt, a reset switching element SWr, a switching element SW, a capacitor C, a first output switching element SWa, a second output switching element SWb, and a resistor RL.

One end of the transfer switching element SWt may be connected to one end (cathode) of the photodiode PD, and the ground may be connected to the other end (anode) of the photodiode PD.

The transfer switching element SWt performs switching operations due to a transfer signal Tx, and the other end of the transfer switching element SWt may be connected to nda node.

The other end of the transfer switching element SWt may be connected to one end of the reset switching element SWr, and the other end of the reset switching element SWr may be connected to ndb node.

The reset switching element SWr may be turned on by a reset signal Reset.

One end of the switching element SW is connected to nda node, the other end of the transfer switching element SWt, and the capacitor C is connected between the other end of the switching element SW and the ground.

One end of the first output switching element SWa is connected to ndb node, the other end of the reset switching element SWr, one end of the second output switching element SWb is connected to the other end of the first output switching element SWa, and the resistor RL is connected between the other end of the second output switching element SWb and the ground.

Meanwhile, the gate terminal of the first output switching element SWa may be connected to nda node which is one end of the switching element SW.

The first sensor pixel Spa in the FIGURE may output pixel data by converting the light of the first area Arm into an electric signal.

In particular, the first sensor pixel Spa in the figure, a sensor pixel based on dual conversion gain, is capable of adjusting sensitivity using the capacitor C and preventing degradation of signal-to-noise ratio (SNR) in the low luminance and high sensitivity imaging condition.

In particular, capacitance may be increased using the internal capacitance across the photodiode PD and the capacitor C.

Figure 5F:
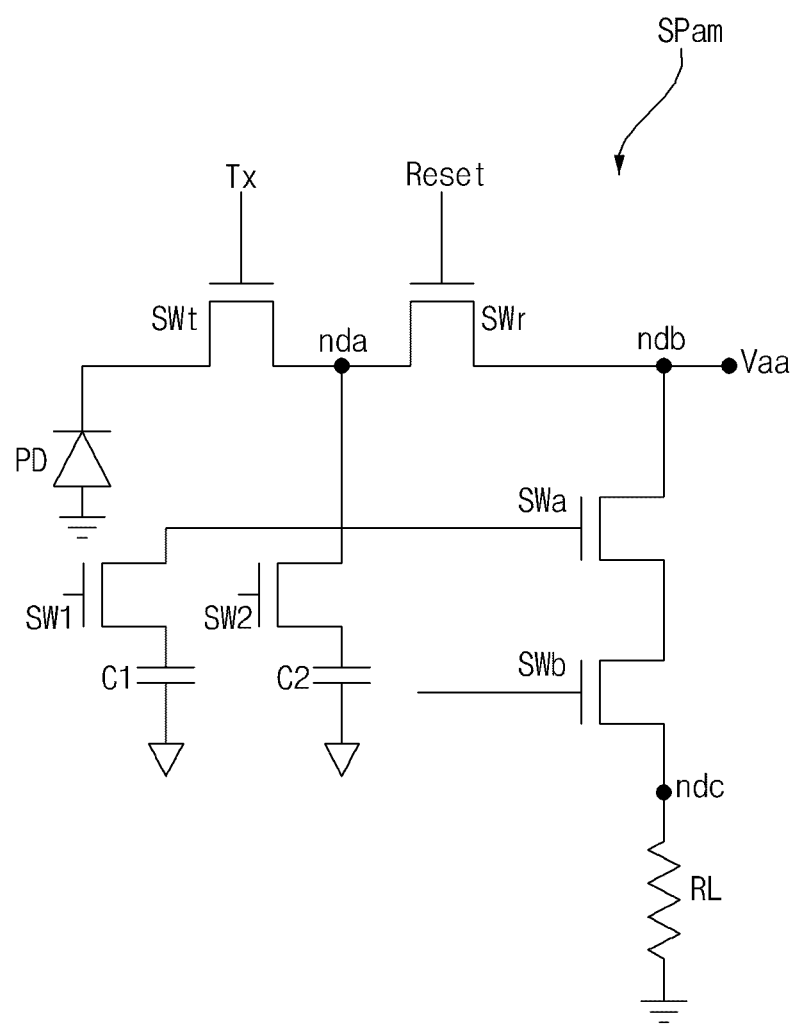

FIG. 5F shows another example of the first sensor pixel SPam within the first area Arm.

Referring to the FIGURE, the first sensor pixel Spaa within the first area Arm may include a photodiode PD converting light into an electric signal, a transfer switching element SWt, a reset switching element SWr, a first switching element SW1, a second switching element SW2, a first capacitor C1, a second capacitor C2, a first output switching element SWa, a second output switching element SWb, and a resistor RL.

Compared with FIG. 5E, the first switching element SW1 and the second switching element SW2 connected in parallel with each other are connected to nda node.

The first capacitor C1 is connected between the first switching element SW1 and the ground, and the second capacitor C2 is connected between the second switching element SW2 and the ground.

Therefore, capacitance may be further increased using the internal capacitance across the photodiode PD, the first capacitor C1, and the second capacitor C2.

Figure 6A:
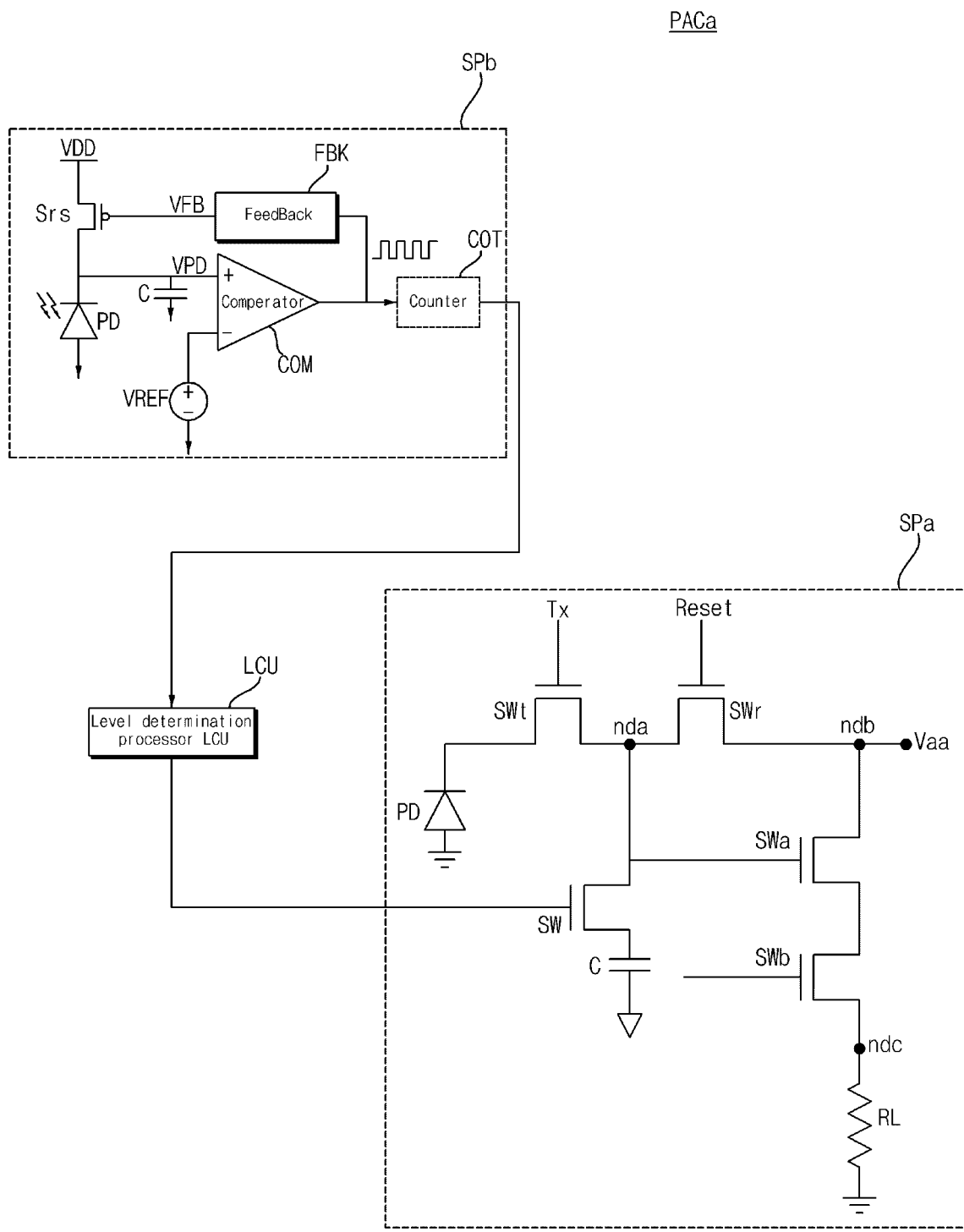
FIG. 6A is an example of an internal circuit diagram of the image sensor of FIG. 4.

FIG. 6A is an example of the internal circuit diagram of the image sensor of FIG. 4. In particular, FIG. 6a is an example of the internal circuit diagram of the image sensor PACa based on the first area Arm.

Referring to the FIGURE, the image sensor PACa based on the first area Arm may include a first reference level determination processor LCU that determines a first reference level based on a pixel signal or a count value from a first light amount detection pixel Spb detecting a first light amount of the first area Arn and a first light amount detection pixel Spb and a first sensor pixel Spa outputting pixel data by converting the light of the first area Arn into an electric signal.

The first light amount pixel Spb detecting the first light amount of the first area Arn may include a photodiode PD converting light into an electric signal, a comparator to output a pulse signal based on a voltage across the photodiode PD and a reference voltage, and a counter COT counting the number of pulses of the pulse signal from the comparator COM.

Meanwhile, the first light amount detection pixel Spb may further include a reset switching element Srs resetting the voltage across the photodiode PD.

Meanwhile, the first light amount detection pixel Spb may further include a feedback circuit FBK outputting a feedback signal to the reset switching element Srs by feeding back the output of the comparator COM.

The reset switching element is connected between a driving voltage source VDD and the photodiode PD.

A first input terminal of the comparator COM is connected to one end (cathode) of the photodiode PD, and a reference voltage source Vref is connected to a second input terminal of the comparator COM.

The comparator COM compares the voltage across the photodiode PD with the reference voltage source Vref and outputs a pulse signal due to the comparison result through an output terminal.

Meanwhile, the counter COT counts the number of pulses of the pulse signal from the comparator COM.

Meanwhile, the feedback circuit FBK feeds back the pulse signal from the comparator COM and outputs a feedback signal VFB, where the feedback signal VFB is input to the reset switching element Srs.

In other words, the reset switching element Srs is reset based on the feedback signal VFB.

Meanwhile, the first reference level determination processor LCU may determine the first reference level based on a pixel signal or a count value from the first light amount detection pixel Spb.

In other words, the first reference level determination processor LCU may output a set level signal based on a pixel signal or a count value from the first light amount detection pixel Spb.

The set level signal is input to the gate terminal of the switching element SW within the first sensor pixel Spa, and accordingly, the switching element SW within the first sensor pixel Spa performs switching based on the level signal set by the first reference level determination processor LCU.

The description of the first sensor pixel Spa will be omitted based on the reference to FIG. 5E.

Figure 6B:
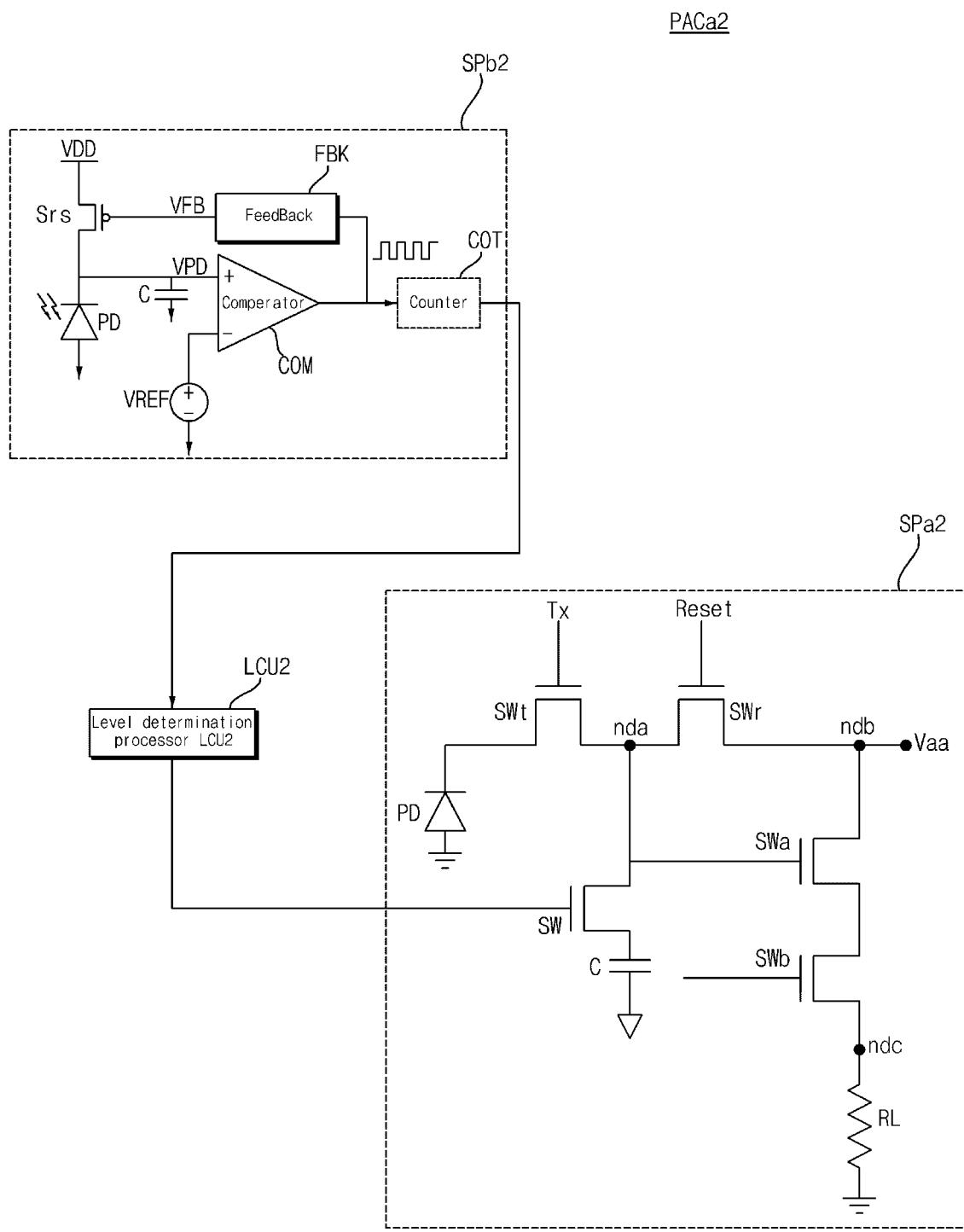
FIG. 6B is another example of an internal circuit diagram of the image sensor of FIG. 4.

FIG. 6B is another example of an internal circuit diagram of the image sensor of FIG. 4. In particular, FIG. 6B is another example of an internal circuit diagram of the image sensor PACa2 based on the second area Arn.

Referring to the FIGURE, the image sensor PACa2 based on the second area Arn may include a second light amount detection pixel Spb2 detecting a second light amount of the second area Arn, and a second reference level determination processor LCU2 determining a second reference level based on a pixel signal or a count value from the second light amount detection pixel Spb2, and a second sensor pixel Spa2 outputting pixel data by converting the light of the second area Arn into an electric signal.

The second light amount pixel Spb2 detecting the second light amount of the second area Arn may include a photodiode PD converting light into an electric signal, a comparator to output a pulse signal based on a voltage across the photodiode PD and a reference voltage, and a counter COT counting the number of pulses of the pulse signal from the comparator COM.

Meanwhile, the second light amount detection pixel Spb2 may further include a reset switching element Srs resetting the voltage across the photodiode PD.

Meanwhile, the second light amount detection pixel Spb2 may further include a feedback circuit FBK outputting a feedback signal to the reset switching element Srs by feeding back the output of the comparator COM.

The reset switching element is connected between a driving voltage source VDD and the photodiode PD.

A first input terminal of the comparator COM is connected to one end (cathode) of the photodiode PD, and a reference voltage source Vref is connected to a second input terminal of the comparator COM.

The comparator COM compares the voltage across the photodiode PD with the reference voltage source Vref and outputs a pulse signal due to the comparison result through an output terminal.

Meanwhile, the counter COT counts the number of pulses of the pulse signal from the comparator COM.

Meanwhile, the feedback circuit FBK feeds back the pulse signal from the comparator COM and outputs a feedback signal VFB, where the feedback signal VFB is input to the reset switching element Srs.

In other words, the reset switching element Srs is reset based on the feedback signal VFB.

Meanwhile, the second reference level determination processor LCU2 may determine the second reference level based on a pixel signal or a count value from the second light amount detection pixel Spb2.

In other words, the second reference level determination processor LCU2 may output a set level signal based on a pixel signal or a count value from the second light amount detection pixel Spb2.

The set level signal is input to the gate terminal of the switching element SW within the second sensor pixel Spa2, and accordingly, the switching element SW within the second sensor pixel Spa2 performs switching based on the level signal set by the second reference level determination processor LCU2.

The description of the second sensor pixel Spa2 will be omitted based on the reference to FIG. 5E.

Meanwhile, referring to FIGS. 6A to 6B, the image sensor PAC according to an embodiment of the present disclosure includes a first light amount detection pixel Spb detecting a first light amount of the first area Arn, a first sensor pixel Spa outputting pixel data by converting the light of the first area Arn into an electric signal, a second light amount detection pixel Spb2 detecting a second light amount of the second area Arn, and a second sensor pixel Spa2 outputting pixel data by converting the light of the second area Arn into an electric signal, where the dynamic range of the first sensor pixel Spa is different from the dynamic range of the second sensor pixel Spa2. Accordingly, it is possible to implement a high dynamic range within one frame. In particular, it is possible to implement a different dynamic range for each region within one frame.

Meanwhile, a conversion gain of the first sensor pixel Spa is different from a conversion gain of the second sensor pixel Spa2. Accordingly, it is possible to implement a different conversion gain for each region within one frame.

Meanwhile, the sensitivity of the first sensor pixel Spa is different from the sensitivity of the second sensor pixel Spa2. Accordingly, it is possible to implement different sensitivity for each region within one frame.

Meanwhile, the slop of voltage change across the photodiode PD within the first sensor pixel Spa is different from the slop of voltage change across the photodiode PD within the second sensor pixel Spa2. Accordingly, it is possible to implement a different slop of voltage change across the photodiode PD for each region within one frame.

Meanwhile, in case in which the second light amount is greater than the first light amount, the dynamic range of the second sensor pixel Spa2 is less than the dynamic range of the first sensor pixel Spa. Accordingly, as the amount of light increases, it is possible to set the dynamic range to decrease.

Meanwhile, in case in which the second light amount is greater than the first light amount, the conversion gain of the second sensor pixel Spa2 is smaller than the conversion gain of the first sensor pixel Spa. Accordingly, as the amount of light increases, it is possible to set the conversion gain to decrease.

Meanwhile, in case in which the second light amount is greater than the first light amount, the sensitivity of the second sensor pixel Spa2 becomes smaller than the sensitivity of the first sensor pixel Spa. Accordingly, as the amount of light increases, it is possible to set the sensitivity of the sensor pixel to decrease.

Meanwhile, in case in which the second light amount is greater than the first light amount, the slop magnitude of voltage change across the photodiode PD within the second sensor pixel Spa2 is greater than the slop magnitude of voltage change across the photodiode PD within the first sensor pixel Spa. Accordingly, as the amount of light increases, it is possible to set the slop magnitude of voltage change across the photodiode PD to increase.

Meanwhile, the image sensor (PAC) according to another embodiment of the present disclosure may include a photodiode PD converting light into an electrical signal, a switching element SW turned on or off based on a gain change signal from the outside, and a capacitor C, one end of which is connected to one end of the switching element, wherein the switching element may perform switching such as being turned off until a first time point T2e during a first frame period and being turned on from the first time point T2e to the second time point T2c during the first frame period based on the gain change signal from the outside. Accordingly, it is possible to change the sensitivity of a pixel in real-time within one frame. Also, it is possible to reduce the occurrence of voltage saturation before the exposure time within one frame.

Meanwhile, before the first time point T2e, the slope of voltage change across the photodiode PD is a first slope S1a, and the slope of voltage change across the photodiode PD from the first time point T2e to the second time point T2c is a second slope S1b exhibiting a smaller change rage than the first slope S1a. Accordingly, it is possible to change the sensitivity of a pixel in real-time within one frame. Also, it is possible to reduce the occurrence of voltage saturation before the exposure time within one frame.

FIGS. 7A to 13C are drawings referenced for description of operations of the image sensor of FIG. 6A or 6B.

Figure 7A:
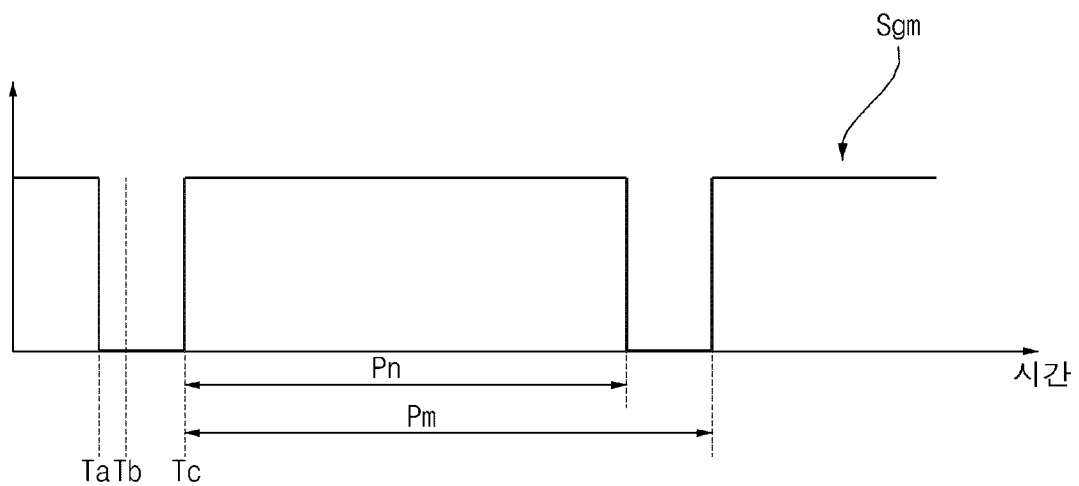
FIGS. 7A to 13C are drawings referenced for description of operations of the image sensor of FIG. 6A or 6B.

First, FIG. 7A is a drawing referenced to describe the operations of the first light amount detection pixel Spb and the first sensor pixel Spa or the operations of the second light amount detection pixel Spb2 and the second sensor pixel Spa2.

Referring to the FIGURE, at the time point Ta, the reset switching element Srs operates to reset the first light amount detection pixel Spb or the second light amount detection pixel Spb2.

From the time point Tb after the time point Ta, a photodiode PD within the first light amount detection pixel Spb or the second light amount detection pixel Spb2 operates.

Afterward, the comparator COM, the counter COT, and the level determination processor LCU, LCU2 within the first light amount detection pixel Spb or the second light amount detection pixel Spb2 start to operate, and from the time point Tc, the first sensor pixel Spa or the second sensor pixel Spa2 operates.

Specifically, from the time point Tc, a switching element SW within the first sensor pixel Spa or the second sensor pixel Spa2 is turned on, and the photodiode PD within the first sensor pixel Spa or the second sensor pixel Spa2 collects charges from the incident light.

Meanwhile, from the time point Tc, during the period Pn, the photodiode PD within the first sensor pixel Spa or the second sensor pixel Spa2 collects charges from the incident light.

Meanwhile, from the time point Tc, the period Pm constitutes one frame, and during the period of one frame, the first light amount detection pixel Spb or the second light amount detection pixel Spb2 are reset, operation of the photodiode PD is performed, and operation of the first sensor pixel Spa or the second sensor pixel Spa2 is performed.

Figure 7B:
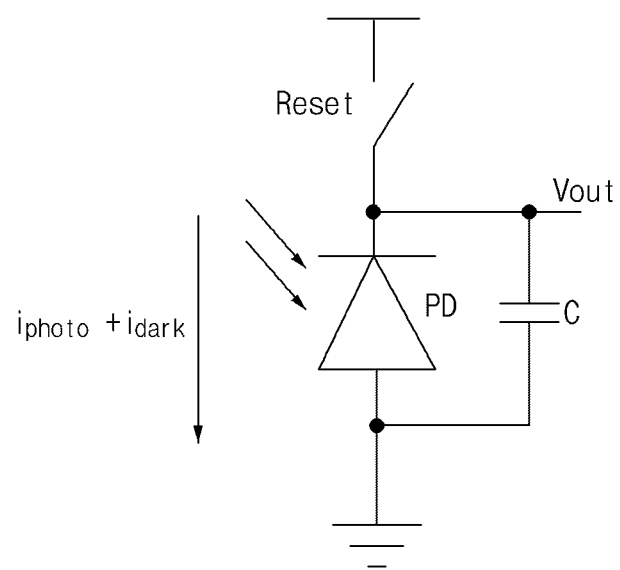

FIG. 7B is a drawing referenced to describe the operation of the photodiode PD.

According to the operation of the reset switching element Srs, a reset operation is performed, and after the reset operation, the voltage across the photodiode PD is varied according to the incident light.

The FIGURE shows a case in which an internal capacitor C is connected across the photodiode PD.

Figure 7C:
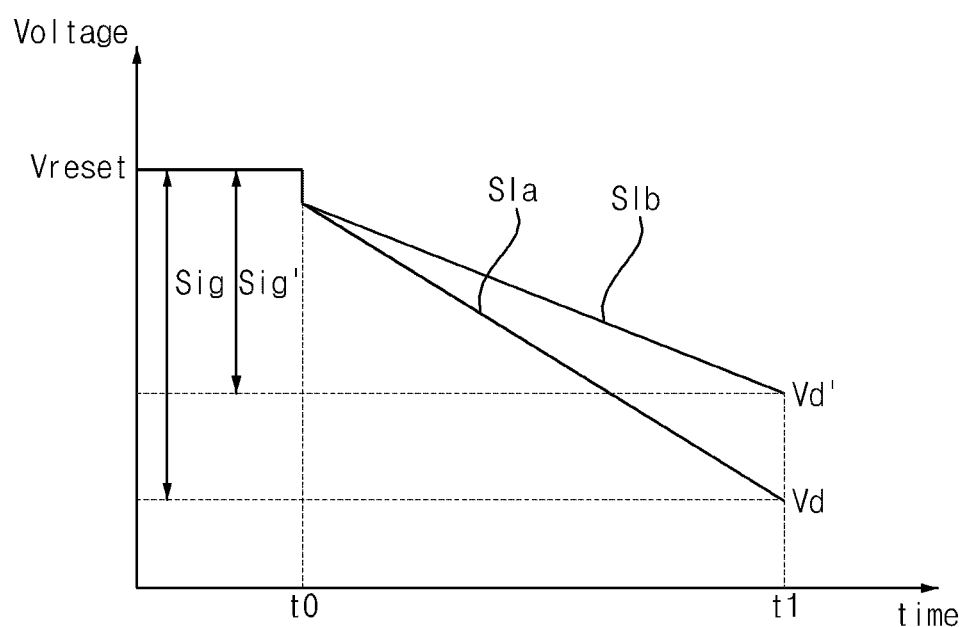

FIG. 7C shows a change of voltage slopes across the photodiode PD due to the amount of light.

For example, according to the reset operation, the voltage across the photodiode PD may maintain Vreset and gradually decrease from the time point t0 to the time point t1.

At this time, as the amount of light increases, the amount of change in the voltage slope or the magnitude of the voltage slope may become larger.

In other words, Sla shows a voltage slope when the amount of light is greater than the case of S1b.

Figure 7D:
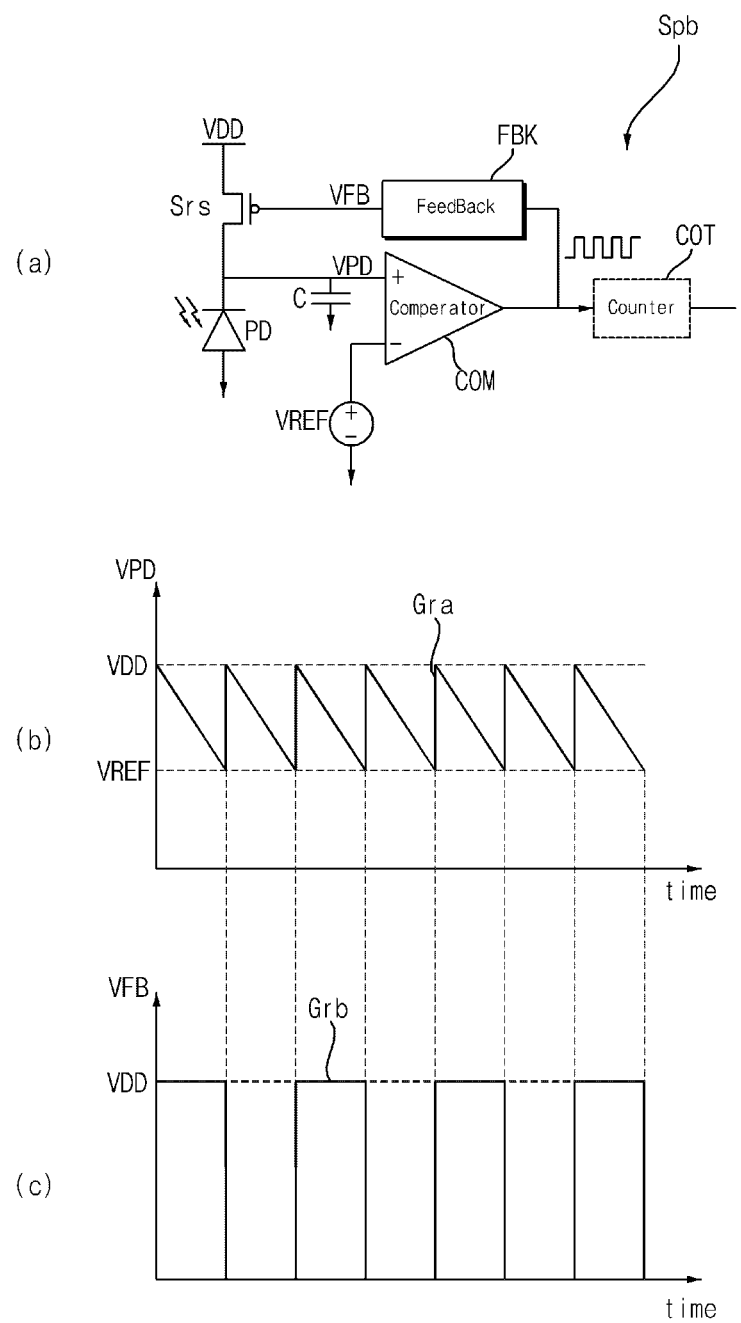

Meanwhile, FIG. 7D illustrates the operation of the first light amount detection pixel Spb or the second light amount detection pixel Spb2 using the characteristics of the photodiode of FIGS. 7b and 7C.

In what follows, descriptions are given mainly based on the first light amount detection pixel Spb.

Referring to the FIGURE, as shown in FIG. 7D(a), the reset operation is periodically performed according to the operation of the reset switching element Srs. Therefore, at the time of reset, the voltage across the photodiode PD is VDD, and after reset, according to the light incident on the photodiode PD, the voltage across the photodiode PD gradually decreases, as shown in FIG. 7D(b).

Meanwhile, when the gradually decreasing voltage across the photodiode PD is the same as Vref, the voltage at the second input terminal of the comparator COM, the feedback circuit FBK switches from a high level VFB to a low level, as shown in FIG. 7D(c).

When the feedback signal VFB output from the feedback circuit FBK switches from the high level VFB to the low level, the reset switching element Srs operates again, and the reset operation is performed. The above operation is repeated.

As a result, according to the operation of the reset switching element Srs, the comparator COM, and the feedback circuit FBK, a waveform Gra as shown in FIG. 7D(b), which decreases periodically, is generated.

Meanwhile, the waveform Grb as shown in FIG. 7D(c) may correspond to the pulse signal output from the comparator COM.

Meanwhile, although FIG. 7D assumes that the amount of incident light is constant, the voltage across the photodiode PD decreases differently according to the amount of incident light, as shown in FIG. 7C.

Figure 8:
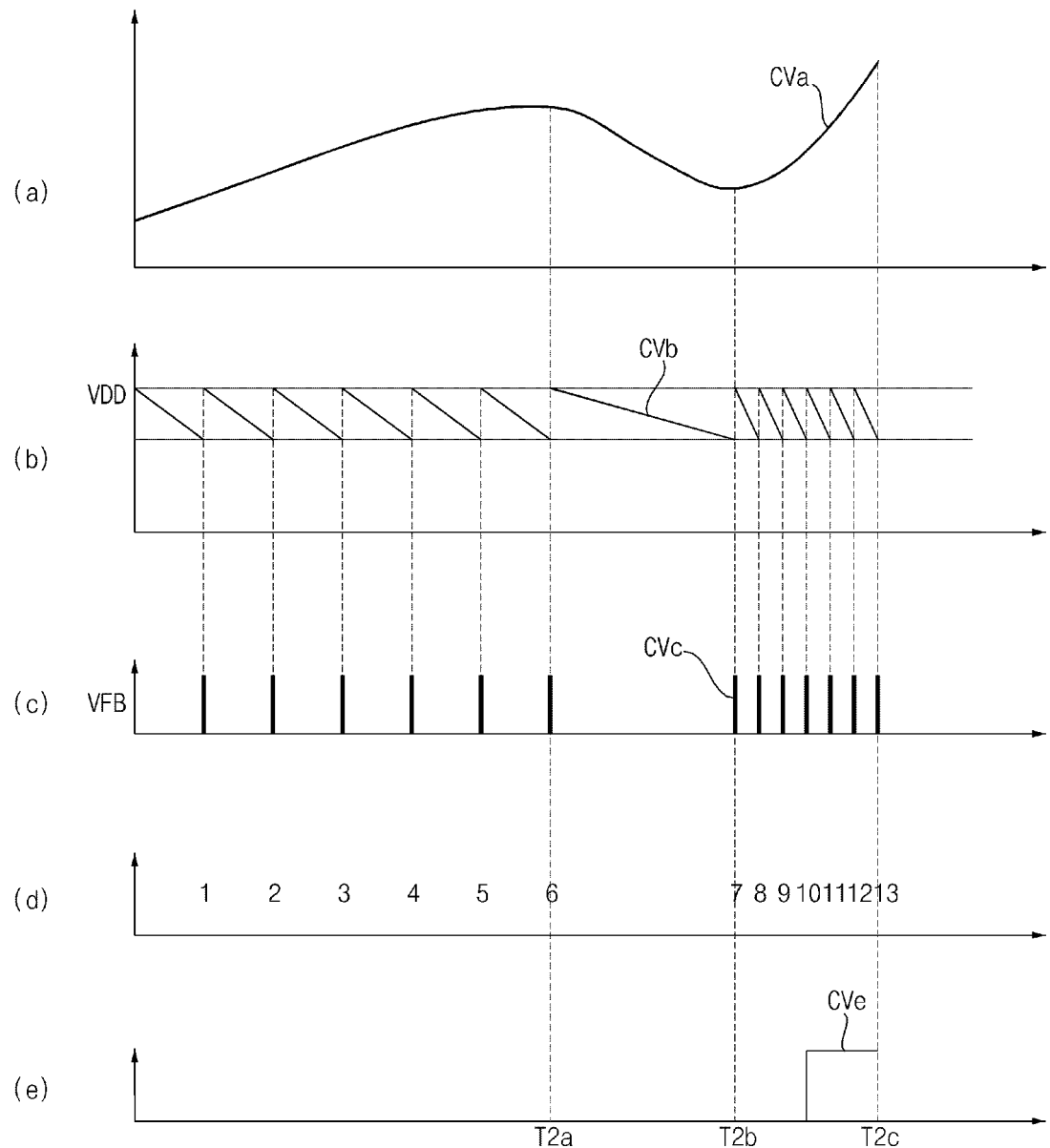

FIG. 8 shows the operation of a counter due to the pulse signal output from the comparator COM and a level signal output from the reference level determination processor when the amount of incident light varies within one frame.

FIG. 8(a) shows a light amount change curve CVa within one frame.

In particular, suppose one frame ranges up to the time point T2c. In this case, the FIGURE shows a case in which the amount of light increases up to the time point T2a, decreases from the time point T2a up to the time point T2b, and again increases from the time point T2b up to the time point T2c.

Accordingly, the voltage across the photodiode PD within the first light amount detection pixel Spb or the second light amount detection pixel Spb2 may be depicted by a graph CVb as shown in FIG. 8(b).

According to the voltage CVb across the photodiode PD as shown in FIG. 8(b), a feedback signal VFB output from the feedback circuit FBK may be output, as shown FIG. 8(c).

Alternatively, as shown in FIG. 8(c), a pulse signal CVc output from the comparator COM may be output according to the voltage across the photodiode PD as shown in FIG. 8(b).

Also, the counter COT may perform counting based on the pulse signal CVc of FIG. 8(c).

Referring to the FIGURE, counting is performed roughly at a constant timing within a specific range up to time point T2a, and when the amount of light decreases from the time point T2a to the time point T2b, counting is performed after a considerably long time, after which, when the amount of light rapidly increases from the time point T2b to the time point T2c, counting is performed within a short period.

Meanwhile, the first reference level determination processor LCU or the second reference level determination processor LCUb may output a high level when the count value is equal to or greater than a predetermined value.

FIG. 8(e) shows a case in which, when the count value is roughly greater than or equal to 10, the first reference level determination processor LCU or the second reference level determination processor LCUb outputs a level signal CVe indicating a high level.

As a result, as the amount of light increases, the output timing of the high-level signal CVe within one frame increases, and as the amount of light decreases, the output timing of the high-level signal CVe may be delayed within one frame, or the level signal may not be output at all.

Figure 9:
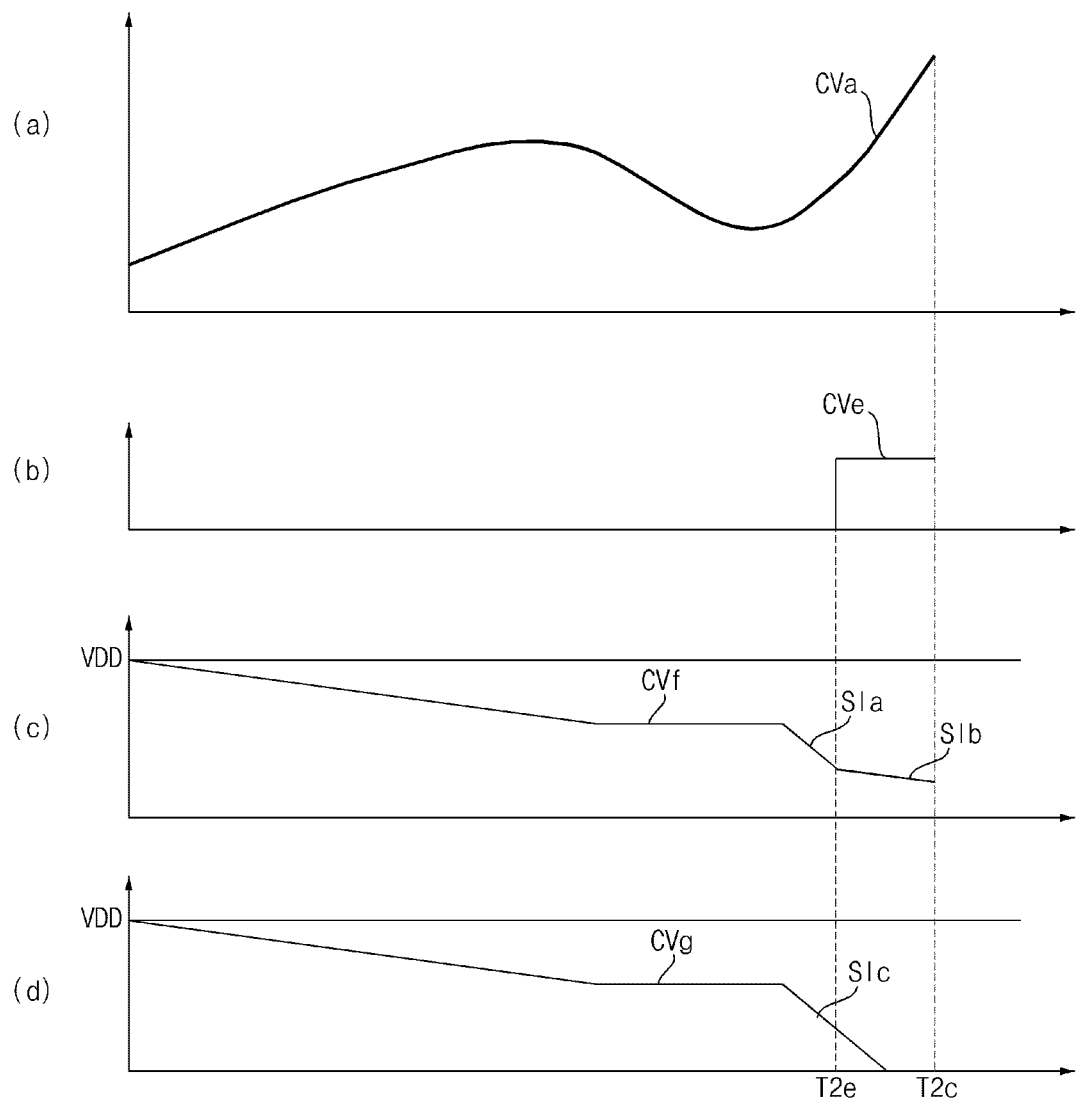

FIG. 9 illustrates the operation of the first sensor pixel Spa or the second sensor pixel Spa2 based on the amount of light and the level signal of FIG. 8.

Referring to the FIGURE, FIG. 9(a) shows a light amount change curve CVa within one frame.

Next, FIG. 9(b) shows that the level signal CVe is at a high-level during the period from the time point T2e to the time point T2c.

Meanwhile, FIG. 9(d) shows a voltage curve CVg across the photodiode PD within a sensor pixel.

For example, when the sensor pixel of FIG. 5E or 5F is used alone without employing a light amount detection pixel, the voltage across the photodiode PD within one frame may appear as shown in FIG. 9(d).

In particular, when the amount of light increases, the voltage falls with a steep slope S1c, and the voltage across the photodiode PD becomes saturated before one frame period.

Accordingly, in the present disclosure, to prevent the voltage across the photodiode PD from being saturated within one frame due to the increase of the amount of light, the first light amount detection pixel Spb or the second light amount detection pixel Spb2 and the first reference level determination processor LCU or the second reference level determination processor LCUb are used.

For example, the first reference level determination processor LCU or the second reference level determination processor LCUb may output the level signal CVe as shown in FIG. 9(b).

Accordingly, the switching element SW within the first sensor pixel Spa or the second sensor pixel Spa2 may perform switching such that the switching element SW is turned off until the first time point T2e during the first frame period and turned on from the first time point T2e to the second time point T2c during the first frame period based on a gain change signal or a level signal from the outside.

Then, the voltage across the photodiode PD within the first sensor pixel Spa or the second sensor pixel Spa2 falls with a slope of Sla at the time point T2e and then, as shown in FIG. 9(c), decreases from the time point T2e to the time point T2c with a slope of S1b, the change rate of which is smaller than the slope of Sla.

Therefore, unlike FIG. 9(d), the voltage across the photodiode PD of FIG. 9(c) is not saturated before one frame period.

Figure 10:
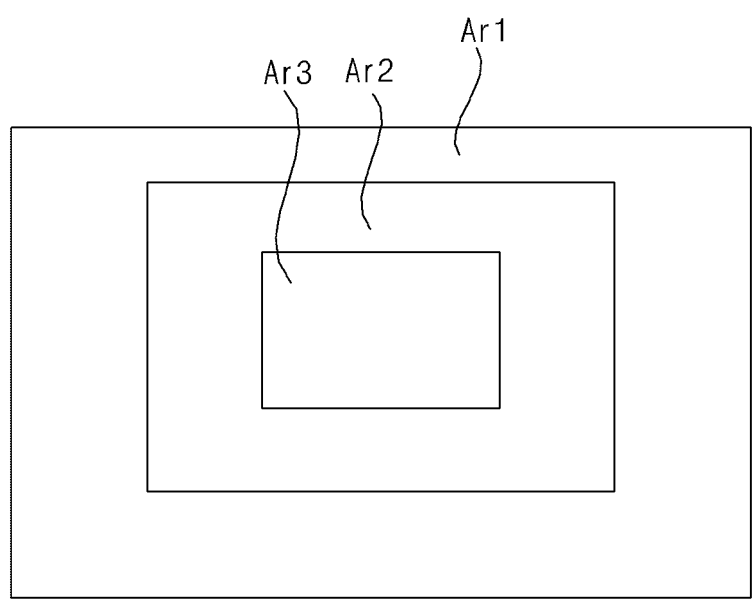

FIG. 10 shows a first area Ar1, the darkest area, a third area Ar3, the brightest area, and a second area Ar2, an intermediate area within one frame.

FIGS. 11A to 13C illustrate an operation using the sensor pixel Spam of FIG. 5F.

Figure 11A:
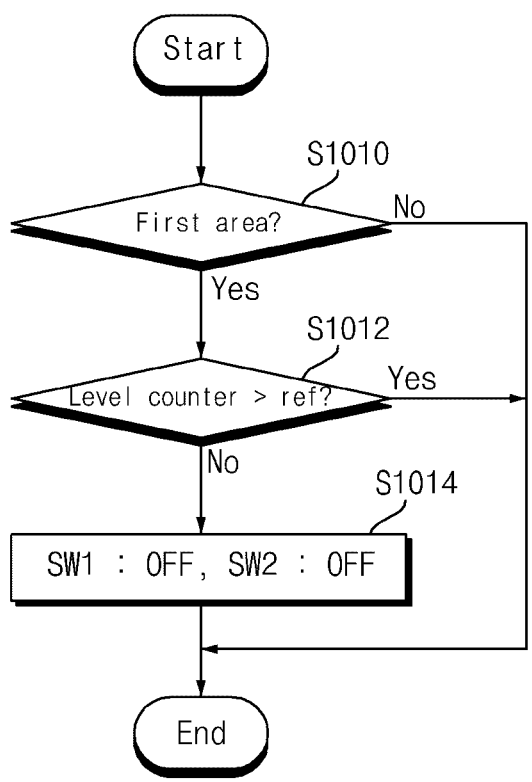

As shown in FIG. 11A, first, in the case of the first area Ar1, the darkest area S1010, the light amount detection pixel within the first area Ar1, which is the darkest area, operates.

Then, the counter COT in the light amount detection pixel within the first area Ar1 determines whether or not the count value exceeds the reference count value, for example, 10 S1012. When the count value does not exceed the reference count value, both the first switching element SW1 and the second switching element SW2 within the sensor pixel Spam of FIG. 5F may be turned off S1014.

Figure 11B:
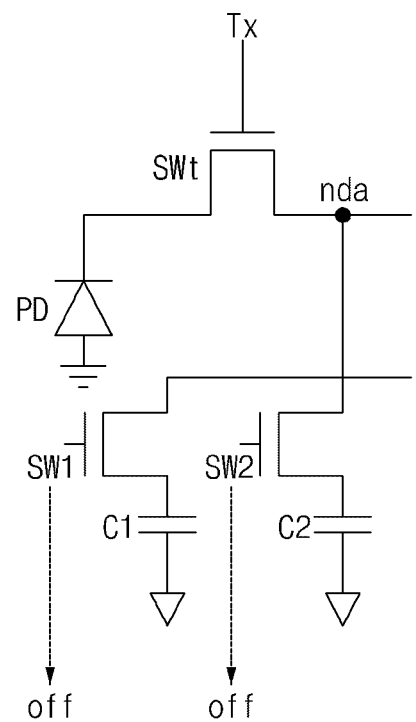

FIG. 11B illustrates a case in which both the first switching element SW1 and the second switching element SW2 within the sensor pixel Spam of FIG. 5F are turned off.

Figure 12A:
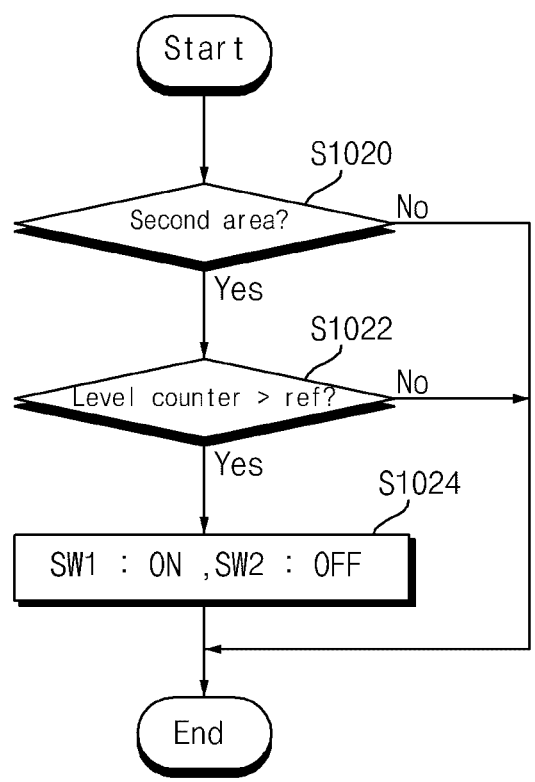

Next, as shown in FIG. 12A, in the case of the second area Ar2, the intermediate area S1020, a light amount detection pixel within the second area Ar2, the intermediate area, operates.

Then, the counter COT within the light amount detection pixel of the second area Ar2 determines whether the count value exceeds a reference value, for example, 10 S1022. When the count value does not exceed the reference value, the counter COT may turn on the first switching element SW1 within the sensor pixel Spam of FIG. 5F but turn off the second switching element SW2 S1024.

Figure 12B:
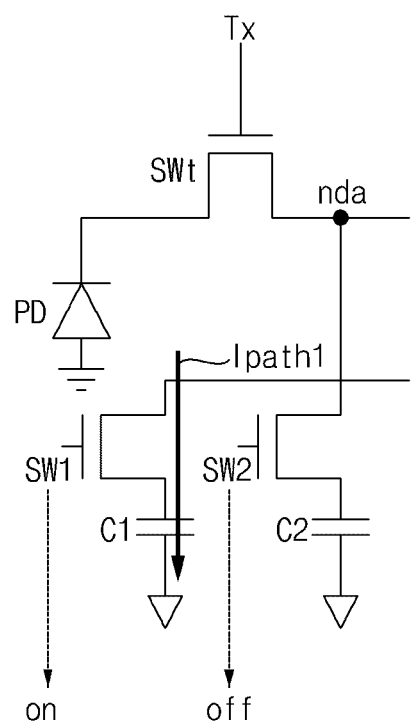

FIG. 12B illustrates a case in which the first switching element SW1 within the sensor pixel Spam of FIG. 5F is turned on, and the second switching element SW2 therein is turned off. Accordingly, a current path Ipath1 may be formed in the first switching element SW1.

Figure 13A:
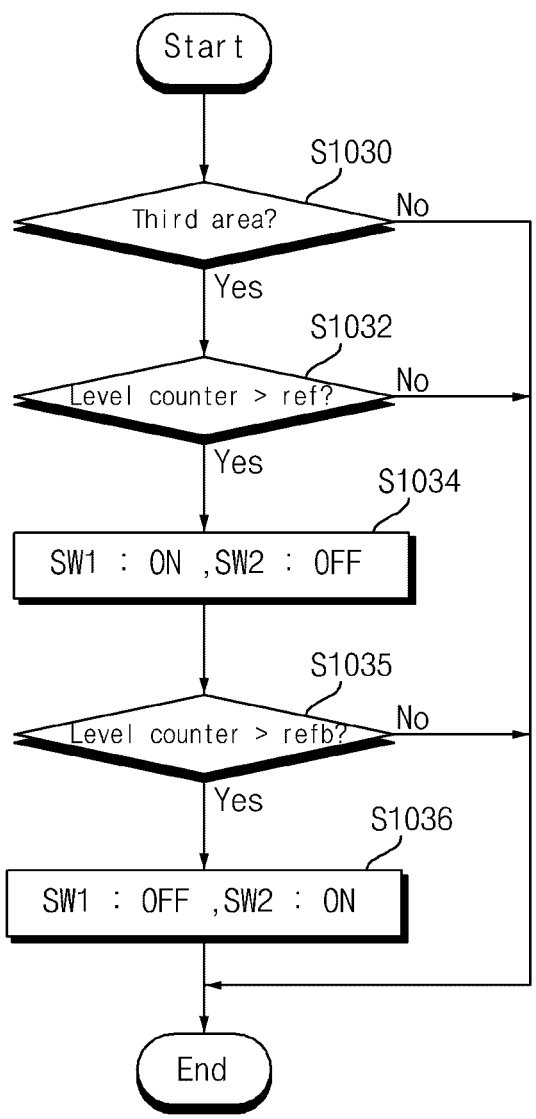

Next, as shown in FIG. 13A, in the case of the third area Ar3, the brightest area S1030, a light amount detection pixel within the third area Ar3, the brightest area, operates.

Then, the counter COT within the light amount detection pixel of the third area Ar3 determines whether the count value exceeds a reference value, for example, 10 S1032. When the count value does not exceed the reference value, the counter COT may turn on the first switching element SW1 within the sensor pixel Spam of FIG. 5F but turn off the second switching element SW2 S1034.

Figure 13B:
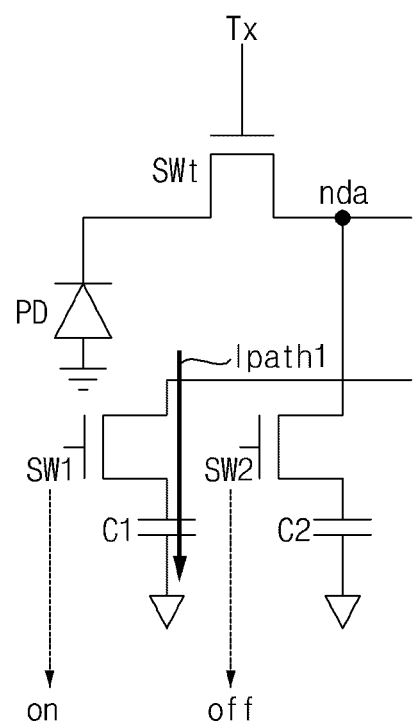

FIG. 13B illustrates a case in which the first switching element SW1 within the sensor pixel Spam of FIG. 5F is turned on, and the second switching element SW2 therein is turned off. Accordingly, a current path Ipath1 may be formed in the first switching element SW1.

Meanwhile, after the first switching element SW1 is turned on, and the second switching element SW2 is turned off, the counter COT within the light amount detection pixel of the third area Ar3 determines whether the count value exceeds a second reference value greater than the reference value, for example, 20 S1035. When the count value exceeds the second reference value, the counter COT may turn off the first switching element SW1 within the sensor pixel Spam of FIG. 5F but turn on the second switching element SW2 S1036.

Figure 13C:
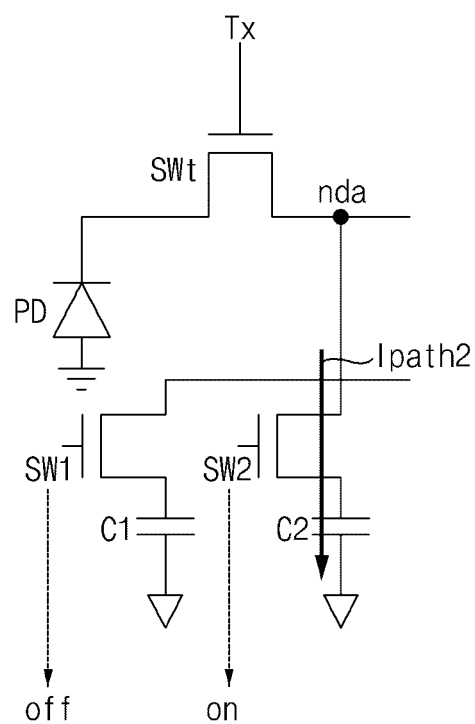

FIG. 13C illustrates a case in which the first switching element SW1 within the sensor pixel Spam of FIG. 5F is turned off, and the second switching element SW2 therein is turned on. Accordingly, a current path Ipath2 may be formed in the second switching element SW2.

Figure 14:
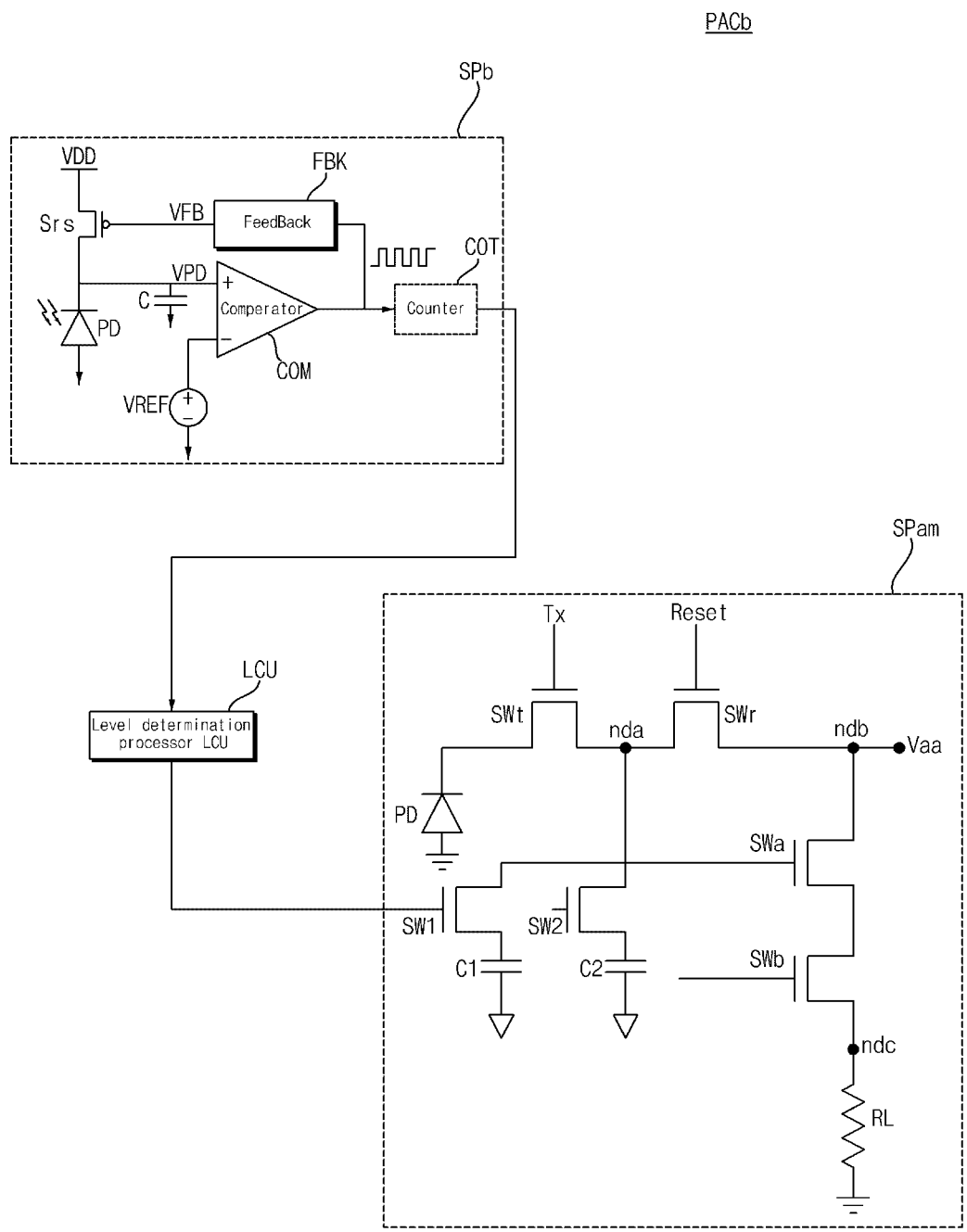
FIG. 14 is yet another example of an internal circuit diagram of the image sensor of FIG. 4.

FIG. 14 is yet another example of an internal circuit diagram of the image sensor of FIG. 4.

Referring to the FIGURE, the image sensor PACb according to yet another embodiment of the present disclosure may have a light amount detection pixel Spb, a level determination processor LCU, and a sensor pixel Spam.

The light amount detection pixel Spb may be related to the light amount detection pixel of FIG. 6A or FIG. 6B, and the level determination processor LCU may be related to the level determination processor of FIG. 6A or FIG. 6B.

Meanwhile, different from FIG. 6A or 6B, the sensor pixel Spam may be related to the sensor pixel of FIG. 5F.

Accordingly, compared to FIG. 5E, the sensor pixel Spam comprises a plurality of switching elements, SW1, SW2 and a plurality of capacitors C1, C2, saturation due to an increase in the amount of light may be reduced.

In particular, even when the on-timing period of the plurality of switching elements SW1, SW2 increases due to the increase in the amount of light, since saturation of voltage across the photodiode is reduced, sensitivity may be further reduced.

As a result, it becomes possible to implement various sensitivity settings, various dynamic ranges, and various conversion gains within one frame. Therefore, a high dynamic range may be implemented within one frame.

Meanwhile, the image sensor described with reference to FIGS. 4 to 16 may be employed for a camera apparatus of the mobile terminal 100 of FIG. 2, a vehicle, TV, a drone, a robot, a robot cleaner, a door, and so forth, which may eventually be applied to various electronic apparatus.

Also, throughout the document, preferred embodiments of the present disclosure have been described with reference to appended drawings; however, the present disclosure is not limited to the embodiments above. Rather, it should be noted that various modifications of the present disclosure may be made by those skilled in the art to which the present disclosure belongs without leaving the technical scope of the present disclosure defined by the appended claims, and these modifications should not be understood individually from the technical principles or perspectives of the present disclosure.

What is claimed is:

1. An image sensor comprising:
   a first light amount detection pixel to detect a first light amount of a first area;
   a first sensor pixel to output pixel data by converting light of the first area into an electric signal;
   a second light amount detection pixel to detect a second light amount of a second area; and
   a second sensor pixel to output pixel data by converting light of the second area into an electric signal,
   wherein a dynamic range of the first sensor pixel is different from a dynamic range of the second sensor pixel,
   wherein after operation of the first light amount detection pixel, the first sensor pixel operates, and after operation of the second light amount detection pixel, the second sensor pixel operates, and
   wherein resets of the first light amount detection pixel and the second light amount detection pixel, operations of the first light amount detection pixel and the second light amount detection pixel, and operations of the first sensor pixel and the second sensor pixel are performed within one frame period.

2. The image sensor of claim 1, wherein conversion gain of the first sensor pixel is different from conversion gain of the second sensor pixel.

3. The image sensor of claim 1, wherein sensitivity of the first sensor pixel is different from sensitivity of the second sensor pixel.

4. The image sensor of claim 1, wherein slope of voltage change across a photodiode within the first sensor pixel is different from slope of voltage change across a photodiode within the second sensor pixel.

5. The image sensor of claim 1, wherein, in case in which the second light amount is greater than the first light amount, the dynamic range of the second sensor pixel is less than the dynamic range of the first sensor pixel.

6. The image sensor of claim 4, wherein, in case in which the second light amount is greater than the first light amount, a slope magnitude of the voltage change across the photodiode within the first sensor pixel is less than a slope magnitude of the voltage change across the photodiode within the second sensor pixel.

7. The image sensor of claim 1, further comprising a first reference level determination processor to determine a first reference level based on a pixel signal or a count value from the first light amount detection pixel; and
   a second reference level determination processor to determine a second reference level based on a pixel signal or a count value from the second light amount detection pixel.

8. The image sensor of claim 7, wherein the first sensor pixel changes the dynamic range of the first sensor pixel based on the first reference level determined by the first reference level determination processor, and
wherein the second sensor pixel changes the dynamic range of the second sensor pixel based on the second reference level determined by the second reference level determination processor.

9. The image sensor of claim 7, wherein the first sensor pixel changes sensitivity of the first sensor pixel based on the first reference level determined by the first reference level determination processor, and
wherein the second sensor pixel changes sensitivity of the second sensor pixel based on the second reference level determined by the second reference level determination processor.

10. The image sensor of claim 1, wherein the first light amount detection pixel comprises:
a photodiode to convert light into an electric signal;
a comparator to output a pulse signal based on a voltage across the photodiode and a reference voltage; and
a counter to count a number of pulses of the pulse signal from the comparator.

11. The image sensor of claim 10, wherein the first light amount detection pixel further includes a reset switching element resetting the voltage across the photodiode.

12. The image sensor of claim 11, wherein the first light amount detection pixel further includes a feedback circuit to output a feedback signal to the reset switching element by feeding back the comparator output.

13. The image sensor of claim 7, wherein the first sensor pixel includes:
a second photodiode to convert light into an electric signal;
a switching element to perform switching based on a signal from the first reference level determination processor; and
a capacitor, one end of which is connected to one end of the switching element.

14. The image sensor of claim 13, wherein the first sensor pixel further includes:
a reset switching element, one end of which is connected to an opposite end of the switching element;
a first output switching element, one end of which is connected to an opposite end of the reset switching element; and
a second output switching element, one end of which is connected to the first output switching element.

15. A camera apparatus comprising an image sensor, wherein the image sensor comprising:
a first light amount detection pixel to detect a first light amount of a first area;
a first sensor pixel to output pixel data by converting light of the first area into an electric signal;
a second light amount detection pixel to detect a second light amount of a second area; and
a second sensor pixel to output pixel data by converting light of the second area into an electric signal,
wherein a dynamic range of the first sensor pixel is different from a dynamic range of the second sensor pixel,
wherein after operation of the first light amount detection pixel, the first sensor pixel operates, and after operation of the second light amount detection pixel, the second sensor pixel operates, and
wherein resets of the first light amount detection pixel and the second light amount detection pixel, operations of the first light amount detection pixel and the second light amount detection pixel, and operations of the first sensor pixel and the second sensor pixel are performed within one frame period.

16. An electronic apparatus comprising an image sensor, wherein the image sensor comprising:
a first light amount detection pixel to detect a first light amount of a first area;
a first sensor pixel to output pixel data by converting light of the first area into an electric signal;
a second light amount detection pixel to detect a second light amount of a second area; and
a second sensor pixel to output pixel data by converting light of the second area into an electric signal,
wherein a dynamic range of the first sensor pixel is different from a dynamic range of the second sensor pixel,
wherein after operation of the first light amount detection pixel, the first sensor pixel operates, and after operation of the second light amount detection pixel, the second sensor pixel operates, and
wherein resets of the first light amount detection pixel and the second light amount detection pixel, operations of the first light amount detection pixel and the second light amount detection pixel, and operations of the first sensor pixel and the second sensor pixel are performed within one frame period.

* * * * *